(12) United States Patent
Horikoshi et al.

(10) Patent No.: US 11,742,211 B2
(45) Date of Patent: Aug. 29, 2023

(54) SUBSTRATE PROCESSING METHOD

(71) Applicant: SCREEN HOLDINGS CO., LTD., Kyoto (JP)

(72) Inventors: Akira Horikoshi, Kyoto (JP); Miyoshi Ueno, Kyoto (JP); Yayoi Takeichi, Kyoto (JP); Takaaki Yanagida, Kyoto (JP); Kenji Nakanishi, Kyoto (JP); Shigeru Takatsuji, Kyoto (JP); Takahiro Kimura, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 17/399,543

(22) Filed: Aug. 11, 2021

(65) Prior Publication Data
US 2022/0102161 A1    Mar. 31, 2022

(30) Foreign Application Priority Data

Sep. 25, 2020   (JP) ................................ 2020-160372

(51) Int. Cl.
*H01L 21/311*     (2006.01)
*H01L 21/02*     (2006.01)

(52) U.S. Cl.
CPC .... *H01L 21/31133* (2013.01); *H01L 21/0206* (2013.01)

(58) Field of Classification Search
CPC ........... H01L 21/31133; H01L 21/0206; H01L 21/02057; H01L 21/67028; H01L 21/67051; H01J 37/32449
See application file for complete search history.

(56) References Cited

U.S. PATENT DOCUMENTS

| | | |
|---|---|---|
| 2011/0221077 A1 | 9/2011 | Ishibashi et al. |
| 2014/0202496 A1 | 7/2014 | Miyagi et al. |
| 2019/0035636 A1* | 1/2019 | Yoshimizu .............. H01J 37/32 |

(Continued)

FOREIGN PATENT DOCUMENTS

| | | | |
|---|---|---|---|
| JP | 2002-053312 A | 2/2002 | |
| JP | 200241277 A * | 2/2002 | ........... H01L 21/027 |
| KR | 20100074673 A * | 7/2010 | ......... H01L 21/8247 |

(Continued)

OTHER PUBLICATIONS

Taiwanese Office Action issued in corresponding Taiwanese Patent Application No. 110133305, dated Nov. 30, 2022, with English translation.

*Primary Examiner* — Duy Vu N Dea
(74) *Attorney, Agent, or Firm* — McDermott Will & Emery LLP

(57) ABSTRACT

A substrate processing method includes: supplying a processing solution onto the upper surface of the substrate; executing, under atmospheric pressure, plasma processing on a liquid film of the processing solution that is formed at least in part of the upper surface of the substrate, with a thickness of the liquid film being a first thickness; and executing, under atmospheric pressure, plasma processing on the liquid film of the processing solution that is formed at least in part of the upper surface of the substrate, with the thickness of the liquid film being a second thickness, in which the first thickness is smaller than the second thickness. Thus, resists on the upper surface of the substrate can be efficiently removed.

8 Claims, 12 Drawing Sheets

(56) References Cited

U.S. PATENT DOCUMENTS

2019/0041743 A1    2/2019  Okita et al.
2021/0086238 A1*   3/2021  Horikoshi ................. B08B 3/08

FOREIGN PATENT DOCUMENTS

| TW | 200727338 A | 7/2007 |
| TW | 200944943 A | 11/2009 |
| TW | 201444010 A | 11/2014 |
| TW | 201739528 A | 11/2017 |
| TW | 202030845 A | 8/2020 |

* cited by examiner

F I G. 4
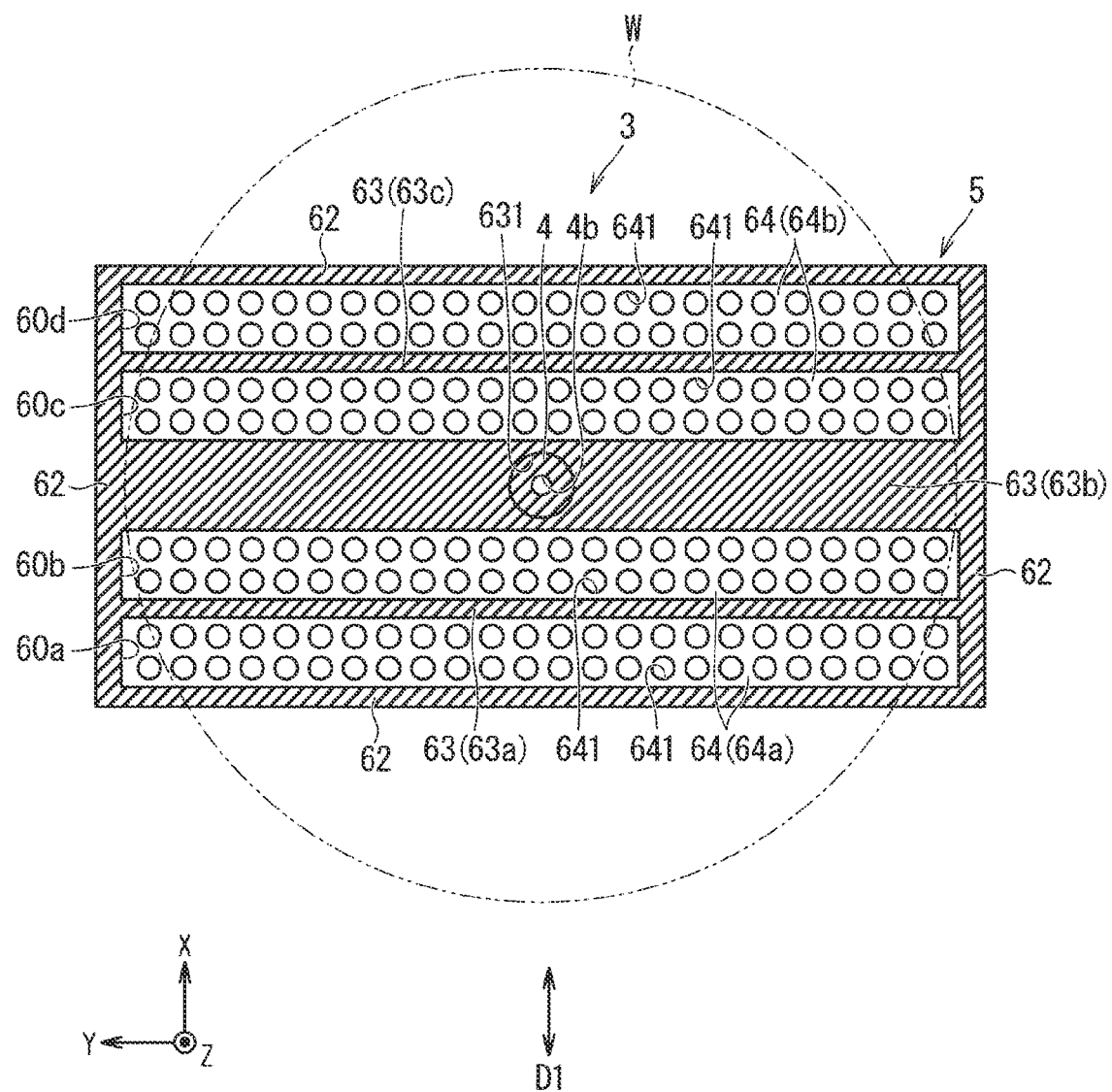

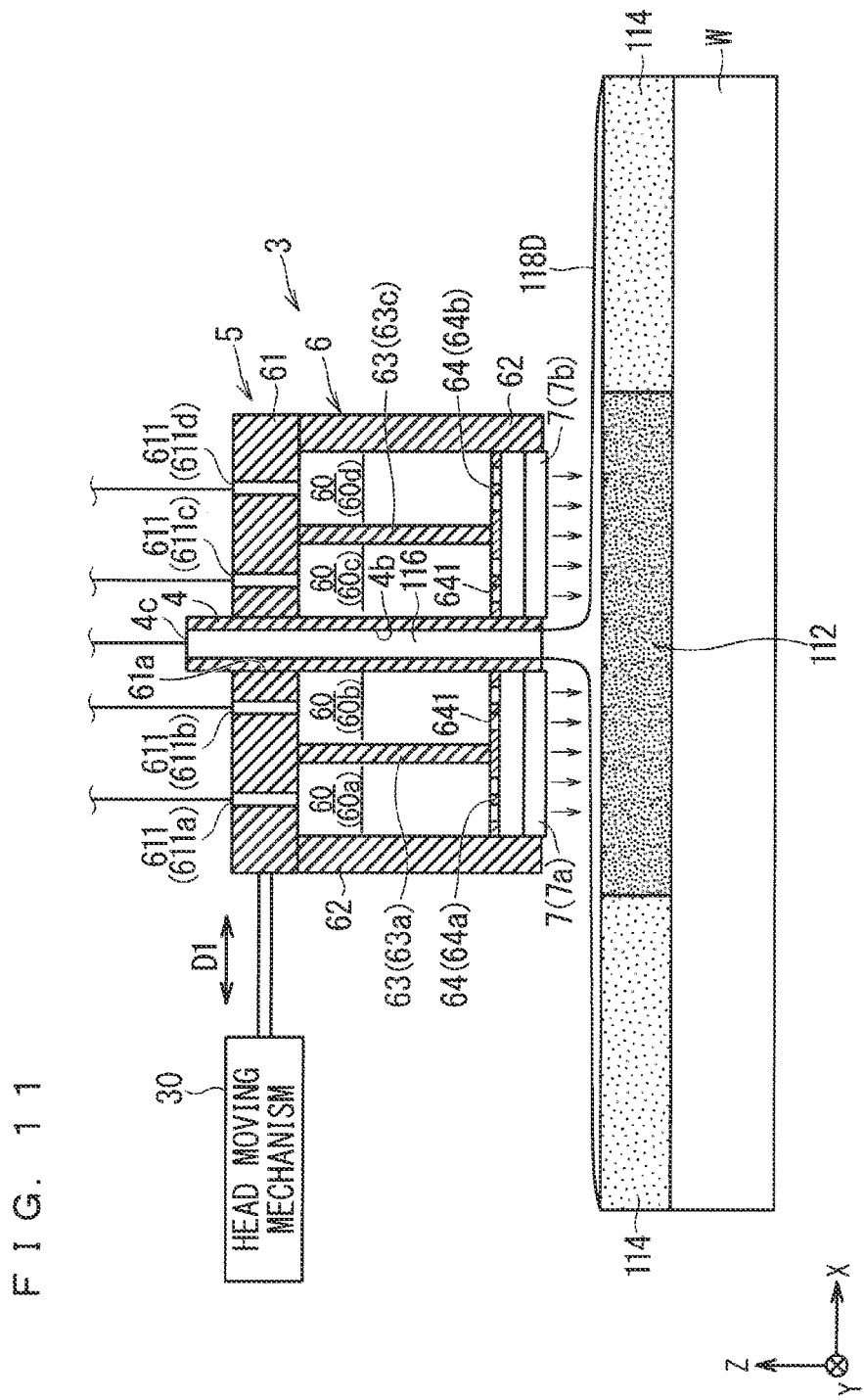
F I G. 1 1

F I G. 13
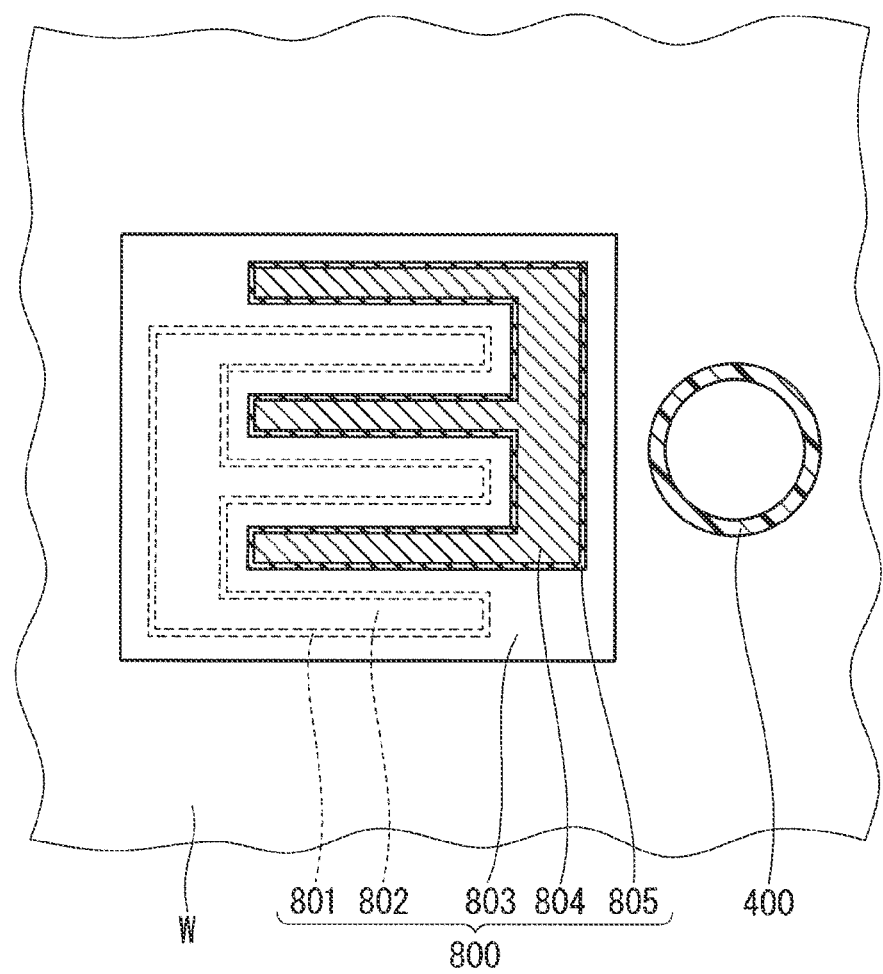

SUBSTRATE PROCESSING METHOD

BACKGROUND OF THE INVENTION

Field of the Invention

The technology disclosed in the present specification relates to a substrate processing method. Examples of substrates to be processed include a semiconductor wafer, a glass substrate for a liquid crystal display device, a substrate for a flat panel display (FPD) such as an organic electroluminescence (EL) display device, a substrate for an optical disk, a substrate for a magnetic disk, a substrate for a magneto-optical disk, a glass substrate for a photomask, a ceramic substrate, a substrate for a field emission display (FED), a substrate for a solar cell, or the like.

Description of the Background Art

Conventionally, there has been a case where plasma processing is executed on a processing solution supplied to a substrate in order to remove a resist used in substrate processing (Japanese Patent Application Laid-Open No. 2002-53312).

When the resist on the upper surface of the substrate is removed by the processing solution while the plasma processing is executed, how much the resist is removed by the processing solution varies depending on the density of the resist pattern.

Thus, there have been problems such as the resist remaining on the upper surface of the substrate and processing for completely removing the resist taking a long period of time.

SUMMARY OF THE INVENTION

The present invention is directed to a substrate processing method.

According to one aspect of the present invention, a substrate processing method of removing a resist from an upper surface of a substrate includes: supplying a processing solution onto the upper surface of the substrate; executing, under atmospheric pressure, plasma processing on a liquid film of the processing solution that is formed at least in part of the upper surface of the substrate, with a thickness of the liquid film being a first thickness; and executing, under atmospheric pressure, plasma processing on the liquid film of the processing solution that is formed at least in part of the upper surface of the substrate, with the thickness of the liquid film being a second thickness, in which the first thickness is smaller than the second thickness.

Resists having different pattern densities can be efficiently removed by executing plasma processing on the liquid films formed to have different thicknesses.

Therefore, an object of the present invention is to efficiently remove resists on the upper surface of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view schematically illustrating an example of a configuration of a nozzle head;

FIG. 11 is a diagram illustrating another example of a liquid film formed on the upper surface of the substrate during the chemical solution processing;

FIG. 13 is a plan view schematically illustrating an example of a configuration of a nozzle head according to a second preferred embodiment.

DESCRIPTION OF THE PREFERRED EMBODIMENTS

Figure 1:
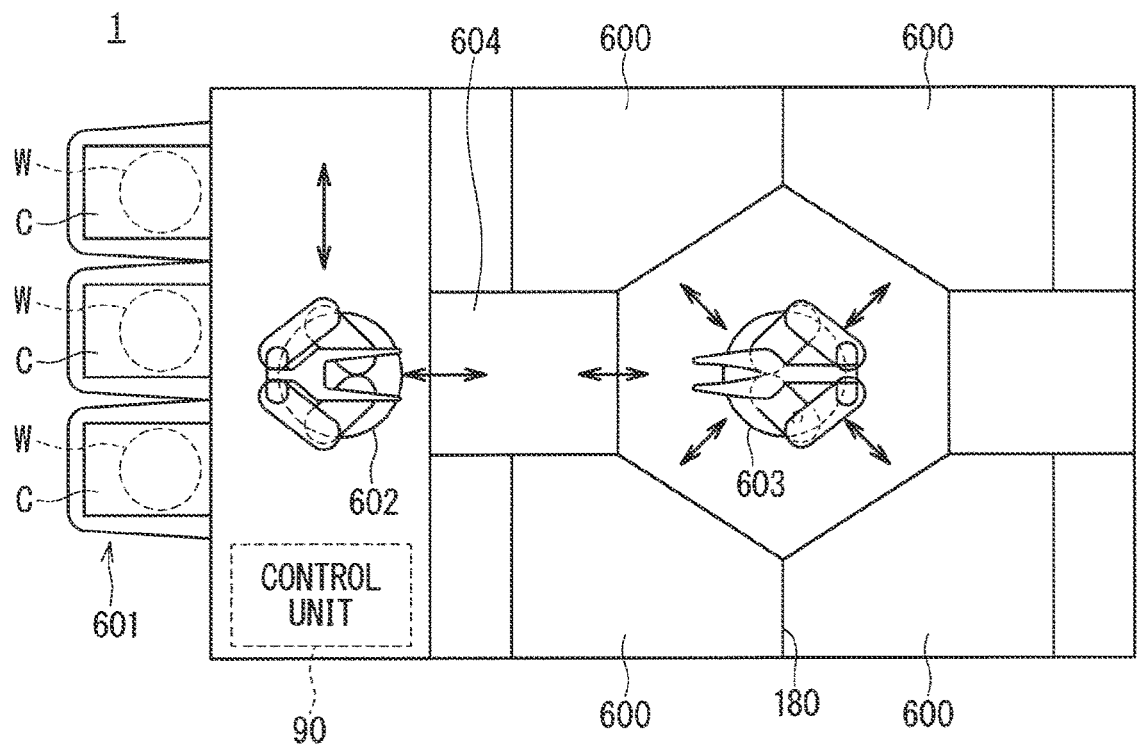
FIG. 1 is a plan view schematically illustrating an example of a configuration of a substrate processing apparatus according to a first preferred embodiment.

Hereinafter, preferred embodiments will be described with reference to the accompanying drawings. In the following preferred embodiments, detailed features and the like are also shown for the description of the technology, but they are merely examples, and not all of them are necessarily essential features for enabling the preferred embodiments to be carried out.

Note that the drawings are schematically illustrated, and omission of configurations or simplification of configurations is made as appropriate in the drawings for convenience of description. In addition, the mutual relationship of sizes and positions of the configurations and the like illustrated in different drawings is not necessarily accurately described, and can be changed as appropriate. In addition, hatching may be applied to drawings such as plan views other than cross-sectional views in order to facilitate understanding of the contents of the preferred embodiment.

Furthermore, in the following description, similar components are denoted by the same reference numerals, and also have similar names and functions. Therefore, detailed description thereof may be omitted in order to avoid duplication.

In addition, in the following description, the phrases "comprising", "including", "having", or the like, a certain component are not exclusive expressions to exclude the presence of other components, unless otherwise specified.

In addition, in the following description, even if ordinal numbers such as "first" or "second" are used, these terms are used for convenience to facilitate understanding of the contents of the preferred embodiments, and are not limited to the order or the like that can be expressed by these ordinal numbers.

In addition, in the following description, expressions indicating an equal state, for example, "same", "equal", "uniform", or "homogeneous" include a case indicating an exactly equal state and a case involving a difference within a range of tolerance or a range that can provide a similar function, unless otherwise specified.

In addition, in the following description, even when terms meaning specific positions or directions such as "upper", "lower", "left", "right", "side", "bottom", "front", or "back" are used, these terms are used for convenience to facilitate understanding of the contents of the preferred embodiments, and are not related to the positions or directions when actually implemented.

Furthermore, in the following description, the phrases "the upper surface of . . . ", "the lower surface of . . . ", or the like are assumed to include a state in which another component is formed on the upper surface or the lower surface of a target component, as well as the upper surface itself or the lower surface itself of the target component. That is, for example, the description "B provided on the upper surface of A" does not preclude the presence of another component "C" between A and B.

Hereinafter, a substrate processing method according to the present preferred embodiment will be described.

First Preferred Embodiment

<Configuration of Substrate Processing Apparatus>

FIG. 1 is a plan view schematically illustrating an example of a configuration of a substrate processing apparatus 1 according to a first preferred embodiment. The substrate processing apparatus 1 includes a load port 601, an indexer robot 602, a center robot 603, a control unit 90, and at least one processing unit 600 (four processing units in FIG. 1).

The processing unit 600 is a single wafer type device that can be used for substrate processing, and specifically, is a device that executes processing of removing organic substances adhering to a substrate W. The organic substance attached to the substrate W is, for example, a used resist film. The resist film is used as, for example, an implantation mask for an ion implantation process.

Note that the processing unit 600 can include a chamber 180. In this case, the processing unit 600 can execute substrate processing in a desired atmosphere, with the control unit 90 controlling the atmosphere in the chamber 180.

The control unit 90 can control the operation of each configuration (a head moving mechanism 30, a chuck 22, a rotation mechanism 23, a valve 46, a valve 52a, a valve 52b, an electrode group 7, and the like, which will be described later.) in the substrate processing apparatus 1. A carrier C is a container that contains the substrate W. The load port 601 is a container holding mechanism that holds a plurality of the carriers C. The indexer robot 602 can convey the substrate W between the load port 601 and a substrate placement portion 604. The center robot 603 can convey the substrate W between the substrate placement portion 604 and the processing unit 600.

With the above configuration, the indexer robot 602, the substrate placement portion 604, and the center robot 603 function as a conveyance mechanism that conveys the substrate W between each processing unit 600 and the load port 601.

The substrate W to be processed is taken out from the carrier C by the indexer robot 602. Then, the substrate W to be processed is delivered to the center robot 603 via the substrate placement portion 604.

The center robot 603 carries the substrate W to be processed into the processing unit 600. Then, the processing unit 600 executes processing on the substrate W.

The substrate W processed in the processing unit 600 is taken out from the processing unit 600 by the center robot 603. Then, the processed substrate W is delivered to the indexer robot 602 via the substrate placement portion 604, after passing through another processing unit 600 if necessary. The indexer robot 602 carries the processed substrate W into the carrier C. In this manner, the substrate W is processed.

Figure 2:
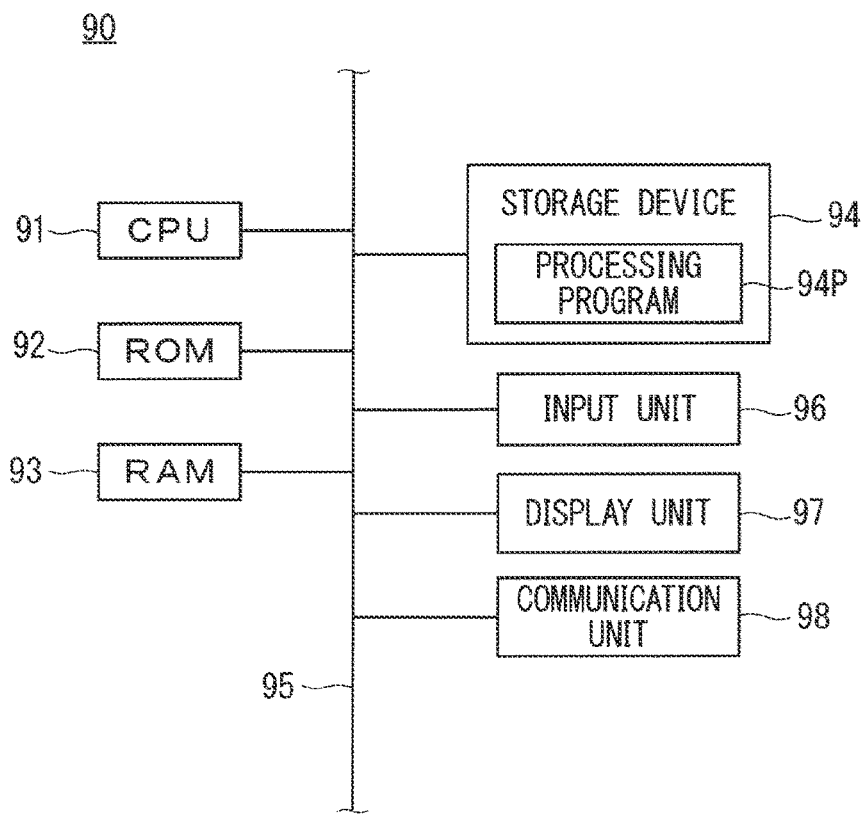
FIG. 2 is a diagram illustrating an example of a configuration of a control unit illustrated as an example in FIG. 1.

FIG. 2 is a diagram illustrating an example of a configuration of the control unit 90 illustrated as an example in FIG. 1. The control unit 90 may be configured by a general computer having an electric circuit. Specifically, the control unit 90 includes a central processing unit (CPU) 91, a read-only memory (ROM) 92, a random access memory (RAM) 93, a storage device 94, an input unit 96, a display unit 97, a communication unit 98, and a bus line 95 connecting these to each other.

The ROM 92 stores a basic program. The RAM 93 is used as a work area for the CPU 91 to execute predetermined processing. The storage device 94 includes a non-volatile storage device such as a flash memory or a hard disk device. The input unit 96 includes various switches, a touch panel, or the like, and receives an input setting instruction such as a processing recipe from an operator. The display unit 97 includes, for example, a liquid crystal display device, a lamp, and the like, and displays various types of information under the control of the CPU 91. The communication unit 98 has a data communication function exerted through a local area network (LAN) or the like.

In the storage device 94, a plurality of modes for control of each configuration in the substrate processing apparatus 1 of FIG. 1 is set in advance. When the CPU 91 executes a processing program 94P, one of the plurality of modes is selected. Then, each configuration is controlled under the selected mode. Note that the processing program 94P may be stored in a recording medium. With this recording medium, the processing program 94P can be installed in the control unit 90. A part or all of the functions executed by the control unit 90 is not necessarily need to be implemented by software, and may be implemented by hardware such as a dedicated logic circuit.

<Configuration of Processing Unit>

Figure 3:
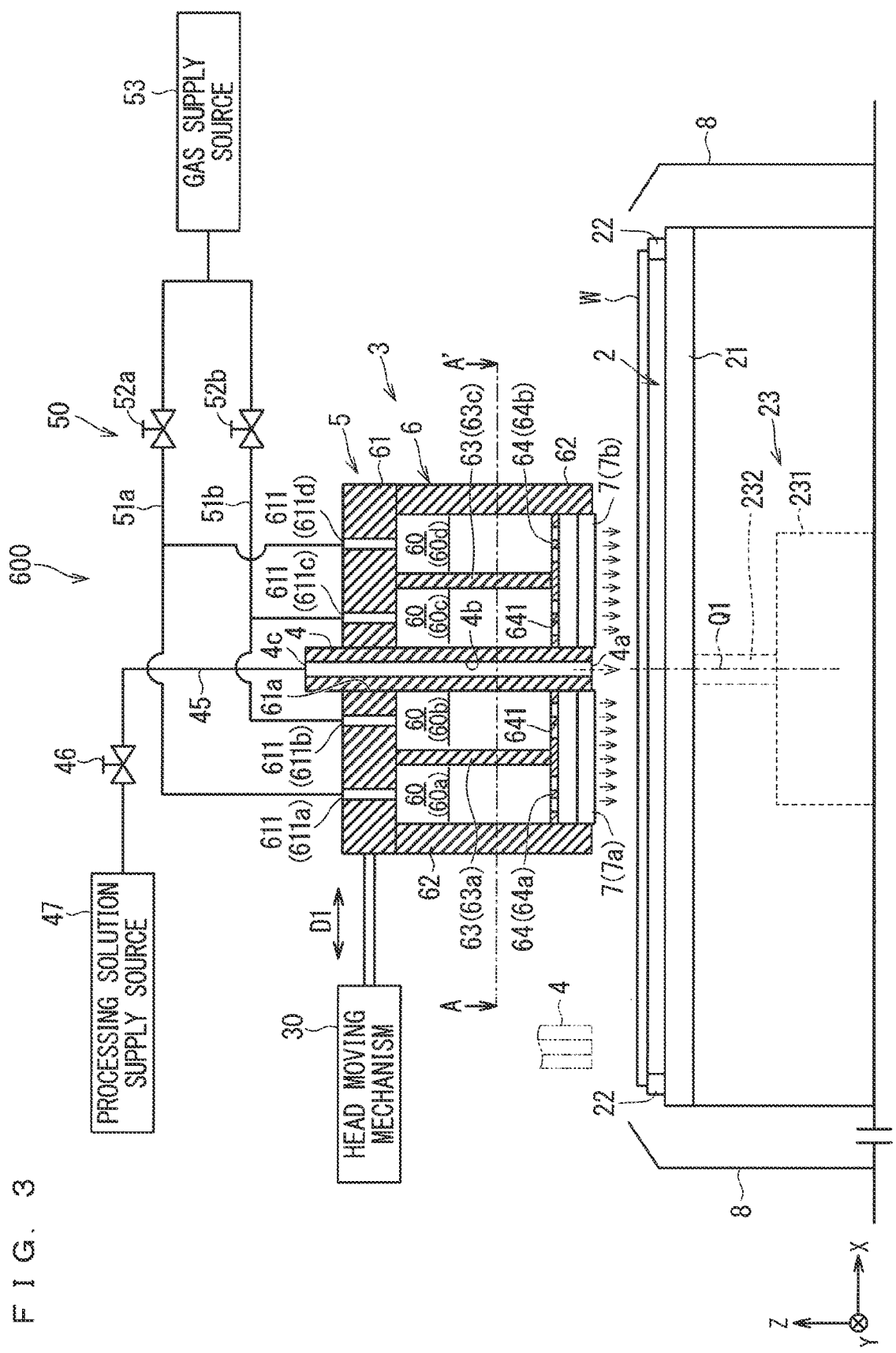
FIG. 3 is a side view schematically illustrating an example of a configuration of a processing unit in the substrate processing apparatus.

FIG. 3 is a side view schematically illustrating an example of a configuration of the processing unit 600 in the substrate processing apparatus 1. Note that the plurality of processing units 600 may have the same configuration or different configurations.

As illustrated in FIG. 3 as an example, the processing unit 600 includes a substrate holding unit 2, a nozzle head 3, and the head moving mechanism 30.

The substrate holding unit 2 rotates the substrate W about a rotation axis Q1 while holding the substrate W in a horizontal orientation. This horizontal orientation means an orientation with which the thickness direction of the substrate W extends along the vertical direction (Z-axis direction in FIG. 3). The rotation axis Q1 is an axis that passes through the center portion of the substrate W and extends along the vertical direction. Such a substrate holding unit 2 is also referred to as a spin chuck.

Hereinafter, a radial direction and a circumferential direction with respect to the rotation axis Q1 may be simply referred to as a radial direction and a circumferential direction.

The nozzle head 3 supplies a processing solution onto the upper surface of the substrate W held by the substrate holding unit 2, and also supplies gas that has passed through an electric field space for plasma described later, onto the upper surface of the substrate W. In FIG. 3, the processing solution flowing from the nozzle head 3 toward the substrate W is schematically indicated by a broken line arrow, and the gas flowing from the nozzle head 3 toward the substrate W is schematically indicated by a solid line arrow. As will be described in detail later, the electric field space refers to a space to which an electric field for generating plasma is applied. When a part of the gas passing through the electric field space turns into plasma, and various active species (for example, an oxygen radical or the like) are generated. The active species move along the flow of gas and to be supplied onto the upper surface of the substrate W (plasma processing).

In the example illustrated in FIG. 3, the nozzle head 3 is provided vertically above the substrate W held by the substrate holding unit 2, and supplies the processing solution and the gas onto the upper surface of the substrate W.

As illustrated in FIG. 3 as an example, the nozzle head 3 includes a processing solution nozzle 4 and a plasma generation unit 5.

The processing solution nozzle 4 has a lower end surface provided with an ejection port 4a, and ejects the processing solution from the ejection port 4a toward the upper surface of the substrate W. The processing solution is assumed to be sulfuric acid herein, but may also be, for example, a liquid containing at least one of a sulfate, a persulphuric acid, and a peroxosulfate, or a chemical solution such as a liquid containing hydrogen peroxide. The processing solution is typically an aqueous solution.

The plasma generation unit 5 is provided at a position adjacent to the processing solution nozzle 4 as viewed along the rotation axis Q1 (that is, in plan view), and is integrally coupled to the processing solution nozzle 4.

Gas is supplied from a gas supply unit 50 to the plasma generation unit 5, and the gas flows through a gas flow path 60 in the plasma generation unit 5 toward the upper surface of the substrate W. As the gas, for example, oxygen-containing gas containing oxygen can be used. The oxygen-containing gas includes, for example, oxygen gas, ozone gas, carbon dioxide gas, air, or gas as a mixture of at least two of these.

The gas may further include inert gas. The inert gas includes, for example, nitrogen gas, argon gas, neon gas, helium gas, or gas that is a mixture of at least two of these.

The plasma generation unit 5 includes an electrode group 7 on the downstream side of the gas flow path 60 as described later, and the electrode group 7 applies an electric field to an electric field space around the plasma generation unit 5. When the gas passes through the electric field space, the electric field acts on the gas. As a result, a part of the gas is ionized, whereby plasma is generated. For example, the plasma is generated with inert gas such as argon gas ionized. Here, as an example, plasma is generated under atmospheric pressure The atmospheric pressure referred to herein is, for example, 80% or more of the standard atmospheric pressure and 120% or less of the standard atmospheric pressure.

The generation of plasma leads to various reactions such as dissociation and excitation of molecules and atoms due to electron collision reaction, and also leads to generation of various active species such as highly reactive neutral radicals. For example, oxygen radicals are generated as a result of ions or electrons of the plasma acting on the oxygen-containing gas. Such active species move along the flow of the gas and flow out from the lower end portion of the plasma generation unit 5 toward the upper surface of the substrate W held by the substrate holding unit 2 (plasma processing).

The nozzle head 3 is provided to be movable by the head moving mechanism 30. The head moving mechanism 30 moves the nozzle head 3 along at least along a movement direction D1 (along the X-axis direction in FIG. 3) along the upper surface of the substrate W held by the substrate holding unit 2. For example, in plan view, the head moving mechanism 30 moves the nozzle head 3 back and forth along the diameter of the substrate W. The head moving mechanism 30 may include, for example, a linear motion mechanism such as a linear motor or a ball screw mechanism.

Alternatively, the head moving mechanism 30 may include an arm-type movement mechanism instead of the linear motion mechanism. In this case, the nozzle head 3 is coupled to a distal end of an arm extending in the horizontal direction. The arm has a base end coupled to a support column extending along the vertical direction. The support column is coupled to the motor and rotates about a center axis of the support column extending along the vertical direction. When the support column rotates about its center axis, the arm turns in a horizontal plane about the center axis. As a result, the nozzle head 3 provided at the distal end of the arm moves in an arc shape about the center axis, in the horizontal plane. The head moving mechanism 30 is configured such that this arc-shaped movement path is along the diameter of the substrate W in plan view. In this manner, the head moving mechanism 30 can move the nozzle head 3 in parallel with the upper surface of the substrate W.

The head moving mechanism 30 can also move the nozzle head 3 between a standby position and a processing position on its movement path. Here, the standby position is a position where the nozzle head 3 does not interfere with the conveyance path of the substrate W when the substrate W is carried in and out or the like, and is, for example, a position more on the outer side than the substrate holding unit 2 in the radial direction in plan view. The processing position is a position where the nozzle head 3 supplies the processing solution and the gas to the substrate W, and is a position where the nozzle head 3 faces the upper surface of the substrate W in the vertical direction.

The head moving mechanism 30 can also move the nozzle head 3 back and forth within a movement range in which the processing solution nozzle 4 faces the upper surface of the substrate W. For example, the head moving mechanism 30 can move the nozzle head 3 back and forth between: a first circumference edge position where the processing solution nozzle 4 faces the circumference edge portion on one side of the substrate W in the diameter direction; and a second circumference edge position where the processing solution nozzle 4 faces the circumference edge portion on the other side of the substrate W. In the example illustrated in FIG. 3, the processing solution nozzle 4 in a state where the nozzle head 3 is positioned at the first circumference edge position is schematically indicated by a two-dot chain line.

With such a processing unit 600, it is possible to supply the processing solution and the gas to the upper surface of the rotating substrate W while the nozzle head 3 moves back and forth (what is known as scan processing). Through such scan processing, the processing solution and the gas can be supplied over the entire upper surface of the substrate W, whereby the substrate W can be more uniformly processed.

In this scan processing, the nozzle head 3 does not necessarily need to move back and forth between the first circumference edge position and the second circumference edge position. For example, the head moving mechanism 30 may move the nozzle head 3 back and forth between a center position where the processing solution nozzle 4 faces a center portion of the substrate W and a first circumference edge position. Also with this configuration, the processing solution and the gas can be supplied entirely over the upper surface of the rotating substrate W.

The processing solution flows radially outward on the upper surface of the substrate W and scatters outward from the circumference edge of the substrate W. Therefore, in the example illustrated in FIG. 3, the processing unit 600 is provided with a cup 8. The cup 8 has a tubular shape surrounding the substrate holding unit 2. The center axis of the tubular shape of the cup 8 matches the rotation axis Q1. The processing solution scattered outward from the circumference edge of the substrate W collides with the inner circumference surface of the cup 8 and flows downward to be collected by a collection mechanism (not illustrated) or discharged to the outside by a discharge mechanism (not illustrated).

The processing unit 600 is provided with an exhaust port (not illustrated) on the radially outer side of the substrate holding unit 2. For example, the cup 8 may be provided with the exhaust port. The active species and the gas supplied to the upper surface of the substrate W flow radially outward along the upper surface of the substrate W and then is discharged through the exhaust port.

<Substrate Holding Unit>

In the example illustrated in FIG. 3, the substrate holding unit 2 includes a base 21, a plurality of the chucks 22, and a rotation mechanism 23.

The base 21 has a disk shape centered on the rotation axis Q1, and has an upper surface provided with the plurality of chucks 22. The plurality of chucks 22 are provided at equal intervals along the circumference edge of the substrate W. The chuck 22 can be driven between a chuck position to be in contact with the circumference edge of the substrate W and a release position to be separated from the circumference edge of the substrate W. The plurality of chucks 22 at the respective chuck positions hold the circumference edge of the substrate W. On the other hand, when the plurality of chucks 22 are at the respective release positions, the holding of the substrate W is released. A chuck driving unit (not illustrated) that drives the plurality of chucks 22 includes, for example, a link mechanism, a magnet, and the like, and is controlled by the control unit 90.

The rotation mechanism 23 includes a motor 231. The motor 231 is coupled to the lower surface of the base 21 via a shaft 232, and the operation thereof is controlled by the control unit 90. When the motor 231 rotates the shaft 232 and the base 21 about the rotation axis Q1, the substrate W held by the plurality of chucks 22 also rotates about the rotation axis Q1.

Note that the substrate holding unit 2 does not necessarily need to include the chucks 22. The substrate holding unit 2 may hold the substrate W by, for example, suction force or electrostatic force.

<Nozzle Head>

FIG. 4 is a cross-sectional view schematically illustrating an example of a configuration of the nozzle head 3. FIG. 4 corresponds to A-A' cross section in FIG. 3. The nozzle head 3 will be described below with reference to FIGS. 3 and 4.

<Processing Solution Nozzle>

The processing solution nozzle 4 of the nozzle head 3 is formed of, for example, an insulator (dielectric) such as resin (For example, polytetrafluoroethylene (PTFE)) or quartz, and has a cylindrical shape in the illustrated example. For preventing elution due to plasma exposure, the processing solution nozzle 4 is preferably formed of quartz or ceramics instead of resin.

The processing solution nozzle 4 has the lower end surface provided with the ejection port 4a. In the illustrated example, a processing solution flow path 4b inside the processing solution nozzle 4 extends along the vertical direction, and the lower end opening of the processing solution flow path 4b corresponds to the ejection port 4a.

One end of a processing solution supply pipe 45 is connected to the processing solution nozzle 4. In the example illustrated in FIG. 3, the upper end of the processing solution nozzle 4 is connected to one end of the processing solution supply pipe 45. Specifically, an upper end opening 4c of the processing solution flow path 4b is connected to one end opening of the processing solution supply pipe 45. On the other hand, the other end of the processing solution supply pipe 45 is connected to the processing solution supply source 47. The processing solution supply source 47 includes, for example, a tank that stores the processing solution.

The processing solution supply pipe 45 is provided with the valve 46. The valve 46 is controlled by the control unit 90, and when the valve 46 is opened, the processing solution flows inside the processing solution supply pipe 45 from the processing solution supply source 47 to be supplied to the processing solution nozzle 4. This processing solution flows through the processing solution flow path 4b from the upper side to the lower side, and is discharged from the ejection port 4a, onto the upper surface of the substrate W. When the valve 46 is closed, the discharge of the processing solution from the ejection port 4a of the processing solution nozzle 4 stops.

The processing unit 600 may be configured to supply a plurality of types of processing solutions onto the upper surface of the substrate W. For example, the processing solution nozzle 4 may have a plurality of processing solution flow paths. In this case, the processing solution flow paths are individually connected to the processing solution supply sources of the respective types. The processing unit 600 may include a nozzle separately from the nozzle head 3.

As the plurality of types of processing solutions, for example, pure water, ozone water, carbonated water, and a rinse liquid such as isopropyl alcohol can be used, in addition to a chemical solution such as sulfuric acid. Here, it is assumed that the processing solution nozzle 4 has a plurality of processing solution flow paths.

<Plasma Generation Unit>

The plasma generation unit 5 includes a unit body 6 and the electrode group 7. The unit body 6 forms the gas flow path 60 for making the gas from the gas supply unit 50 flow toward the upper surface of the substrate W. The electrode group 7 is provided on the downstream side of the gas flow path 60, and is configured to enable the gas to pass therethrough as described later. The electrode group 7 applies voltage to the surrounding space (electric field space). When the gas passes through the electric field space, an electric field is applied to the gas. The application of the electric field results in a part of the gas is ionized whereby plasma is generated. This generation of the plasma involves generation of various active species. These active species are supplied to the upper surface of the substrate W along the gas flow (plasma processing).

<Unit Body>

The unit body 6 is formed of, for example, an insulator (dielectric) such as quartz or ceramics. In the illustrated example, the unit body 6 includes an upper surface portion 61 and a side wall portion 62.

The upper surface portion 61 has, for example, a plate shape, and is orientated to have a thickness direction extending along the vertical direction. The upper surface portion 61 has, for example, a rectangular shape in plan view. The upper surface portion 61 is to have one side extending along the movement direction D1 of the nozzle head 3, for example. In the example illustrated in FIG. 3, a through hole 61a is formed in the center portion of the upper surface portion 61. The through hole 61a is formed through the upper surface portion 61 along the vertical direction, and the processing solution nozzle 4 is provided through the through hole 61a. In this manner, the processing solution nozzle 4 is fixed to the upper surface portion 61.

The side wall portion 62 is provided on the entire circumference of the circumference edge of the upper surface portion 61 and extends vertically downward from the circumference edge of the upper surface portion 61. The side wall portion 62 has a rectangular tube shape surrounding the processing solution nozzle 4. A space surrounded by the upper surface portion 61 and the side wall portion 62 corresponds to the gas flow path 60.

An inlet 611 communicating with the gas flow path 60 is formed in the unit body 6. In the example illustrated in FIG. 3, the inlet 611 is formed in the upper surface portion 61. The inlet 611 is connected to the gas supply unit 50, and the gas supply unit 50 supplies gas to the gas flow path 60 through the inlet 611.

In the illustrated example, the unit body 6 includes one or more flow path partition portions 63 that partition the gas flow path 60 into a plurality of divided gas flow paths that are a divided gas flow path 60a, a divided gas flow path 60b, a divided gas flow path 60c, and a divided gas flow path 60d in the movement direction D1 of the nozzle head 3.

Here, the flow path partition portion 63 include three flow path partition portions that are a flow path partition portion 63a, a flow path partition portion 63b, and a flow path partition portion 63c (see FIG. 4), whereby the gas flow path 60 is partitioned into four gas flow paths that are the divided gas flow path 60a, the divided gas flow path 60b, the divided gas flow path 60c, and the divided gas flow path 60d.

Each of the flow path partition portions 63 has, for example, a plate shape, and is orientated to have the thickness direction extending along the movement direction D1. The flow path partition portion 63a, the flow path partition portion 63b, and the flow path partition portion 63c are disposed in this order from one side to the other side in the movement direction D1. An upper end surface of each of the flow path partition portions 63 is coupled to a lower surface of the upper surface portion 61, and both side end surfaces of the flow path partition portion 63 are coupled to an inner surface of the side wall portion 62.

In the illustrated example, the three flow path partition portions 63a, 63b, and 63c form the divided gas flow path 60a, the divided gas flow path 60b, the divided gas flow path 60c, and the divided gas flow path 60d arranged in this order in movement direction D1.

In the example illustrated in FIG. 4, a through hole 631 through which the processing solution nozzle 4 is provided is formed in the flow path partition portion 63b. Thus, the divided gas flow path 60a and the divided gas flow path 60b are positioned on one side of the processing solution nozzle 4 in the movement direction D1, whereas the divided gas flow path 60c and the divided gas flow path 60d are positioned on the other side of the processing solution nozzle 4 in the movement direction D1. Thus, the gas flow paths 60 are formed on both sides of the processing solution nozzle 4 in the movement direction D1.

The divided gas flow path 60b and the divided gas flow path 60c are formed at positions closer to the processing solution nozzle 4 in the movement direction D1, and the divided gas flow path 60a and the divided gas flow path 60d are formed at positions farther from the processing solution nozzle 4 in the movement direction D1. In other words, a distance from the divided gas flow path 60b and the divided gas flow path 60c to the processing solution nozzle 4 is shorter than a distances from the divided gas flow path 60a and the divided gas flow path 60d to the processing solution nozzle 4.

In the example illustrated in FIG. 3, an inlet 611a, an inlet 611b, an inlet 611c, and an inlet 611d are formed in the upper surface portion 61 as the inlet 611 connected to the gas flow path 60.

The inlet 611a is connected to the divided gas flow path 60a, the inlet 611b is connected to the divided gas flow path 60b, the inlet 611c is connected to the divided gas flow path 60c, and the inlet 611d is connected to the divided gas flow path 60d.

The gas supply unit 50 supplies gas to the divided gas flow path 60a, the divided gas flow path 60b, the divided gas flow path 60c, and the divided gas flow path 60d respectively through the inlet 611a, the inlet 611b, the inlet 611c, and the inlet 611d.

In the example illustrated in FIG. 3, the gas supply unit 50 includes a gas supply pipe 51a and a gas supply pipe 51b, as well as the valve 52a and the valve 52b.

The gas supply pipe 51a includes two branch pipes and a common pipe. One ends of the branch pipes are connected to the inlet 611a and the inlet 611d, respectively. The other ends of the branch pipes are commonly connected to one end of the common pipe. The other end of the common pipe is connected to a gas supply source 53. In this manner, the gas supply pipe 51a connects the inlet 611a and the inlet 611d to the gas supply source 53.

The gas supply pipe 51b also includes two branch pipes and a common pipe, and connects the inlet 611b and the inlet 611c to the gas supply source 53, as in the case of the gas supply pipe 51a.

The valve 52a is provided to the common pipe of the gas supply pipe 51a and is controlled by the control unit 90. When the valve 52a is opened, the gas from the gas supply source 53 flows inside the gas supply pipe 51a, and flows into the corresponding divided gas flow path 60a and divided gas flow path 60d through the inlet 611a and the inlet 611d, respectively. When the valve 52a is closed, the supply of gas to the divided gas flow path 60a and the divided gas flow path 60d stops. The valve 52a may be a flow rate adjusting valve capable of adjusting the flow rate of the gas flowing inside the gas supply pipe 51a. Furthermore, a flow rate adjusting valve may be provided separately from the valve 52a.

The valve 52b is provided to the common pipe of the gas supply pipe 51b and is controlled by the control unit 90. When the valve 52b is opened, the gas from the gas supply source 53 flows inside the gas supply pipe 51b, and flows into the corresponding divided gas flow path 60b and divided gas flow path 60c through the inlet 611b and the inlet 611c, respectively. When the valve 52b is closed, the supply of gas to the divided gas flow path 60b and the divided gas flow path 60c stops. The valve 52b may be a flow rate adjusting valve capable of adjusting the flow rate of the gas flowing inside the gas supply pipe 51b. Furthermore, a flow rate adjusting valve may be provided separately from the valve 52b.

With such a gas supply unit 50, the flow rate of the gas flowing through the divided gas flow path 60a and the divided gas flow path 60d and the flow rate of the gas flowing through the divided gas flow path 60c and the divided gas flow path 60b can be individually adjusted.

Thus, the flow rates of the gas in the divided gas flow path 60b and the divided gas flow path 60c close to the processing solution nozzle 4 can be adjusted independently from the flow rates of the gas in the divided gas flow path 60a and the divided gas flow path 60d far from the processing solution nozzle 4. For example, the respective flow rates can be adjusted to make the flow velocity of the gas in divided gas flow path 60b and divided gas flow path 60c higher than the flow velocity of the gas in divided gas flow path 60a and divided gas flow path 60d. This effect will be described in detail later.

In the example illustrated in FIG. 3, the gas supply unit 50 collectively adjusts the flow rates in the divided gas flow path 60b and the divided gas flow path 60c. Alternatively, a configuration with which the flow rates in the divided gas flow path 60b and the divided gas flow path 60c can be adjusted independently of each other may be employed. The same applies to the divided gas flow path 60a and the divided gas flow path 60d.

In the example illustrated in FIG. 4, the width of the gas flow path 60 (the divided gas flow path 60a, the divided gas flow path 60b, the divided gas flow path 60c, and the divided gas flow path 60d) in the direction orthogonal to the movement direction D1 is larger than the width of the ejection port 4a of the processing solution nozzle 4, and is, for example, equal to or larger than the radius of the substrate W, more desirably equal to or larger than the diameter of the substrate W. Note that the width of the gas flow path 60 may vary among positions in the movement direction D1 due to production tolerance or the like. In this case, the gas flow path 60 may be have any width, as long as the maximum value of the width is larger than the width of the ejection port 4a of the processing solution nozzle 4, that is, equal to or larger than the radius of the substrate W, more desirably, equal to or larger than the diameter of the substrate W for example. With this configuration, the plasma generation unit 5 can supply the gas over a larger range on the upper surface of the substrate W in plan view. Thus, the gas can be more uniformly supplied over the upper surface of the substrate W.

In the illustrated example, the unit body 6 further includes a plate-like body 64. The plate-like body 64 is provided in the gas flow path 60. Specifically, the plate-like body 64 is provided on the upstream side of the gas flow with respect to the electrode group 7, and is provided at a position facing the electrode group 7 in the vertical direction.

The plate-like body 64 has a plate shape, and is orientated to have the thickness direction extending along the vertical direction. A plurality of openings 641 are formed in the plate-like body 64, and the gas flows toward the electrode group 7 through the plurality of openings 641.

Here, a plate-like body 64a and a plate-like body 64b are provided as the plate-like body 64.

The plate-like body 64a is provided to correspond to the divided gas flow path 60a and the divided gas flow path 60b. In the example illustrated in FIG. 3, the lower end of the flow path partition portion 63a is coupled to the upper surface of the plate-like body 64a. The circumference edge of plate-like body 64a is coupled to the side wall portion 62 and the flow path partition portion 63b.

The plate-like body 64b is provided to correspond to the divided gas flow path 60c and the divided gas flow path 60d. In the example illustrated in FIG. 3, the lower end of the flow path partition portion 63c is coupled to the upper surface of the plate-like body 64b. The circumference edge of plate-like body 64b is coupled to the side wall portion 62 and the flow path partition portion 63b.

The plurality of openings 641 is formed through the plate-like body 64 in the vertical direction, and have, for example, a circular shape in plan view. The plurality of openings 641 are two-dimensionally arranged in plan view, to be in a form of a matrix, for example.

The gas flowing through each of the divided gas flow path 60a and the divided gas flow path 60b passes through the plurality of openings 641 of the plate-like body 64a to flow toward an electrode group 7a.

The gas flowing through each of the divided gas flow path 60c and the divided gas flow path 60d passes through the plurality of openings 641 of the plate-like body 64b to flow toward an electrode group 7b.

As described above, the gas passes through the plurality of openings 641, whereby the gas can uniformly flow toward the electrode group 7. When the distance between the plate-like body 64 and the electrode group 7 becomes long, the uniformity of the gas may be compromised, and thus the distance may be set while taking the uniformity of the gas into consideration.

<Electrode Group>

The electrode group 7 is provided on the downstream side of the gas flow path 60 as described above, and is provided in a region overlapping the gas flow path 60 in plan view. When the gas passes through the electrode group 7, the electrode group 7 applies an electric field to the gas. As a result, a part of the gas is ionized, whereby plasma is generated.

In the example illustrated in FIG. 3, the electrode group 7a and the electrode group 7b are provided as the electrode group 7. In the example illustrated in FIG. 3, the electrode group 7a is provided more on the downstream side than the divided gas flow path 60a and the divided gas flow path 60b, and the electrode group 7b is provided more on the downstream side than the divided gas flow path 60c and the divided gas flow path 60d.

The electrode group 7a faces the divided gas flow path 60a and the divided gas flow path 60b in the vertical direction, and the electrode group 7b faces the divided gas flow path 60c and the divided gas flow path 60d in the vertical direction. That is, in the example illustrated in FIG. 3, the electrode group 7a and the electrode group 7b are provided on sides opposite to each other, with the processing solution nozzle 4 provided in between, in the movement direction D1 of the nozzle head 3. In short, the electrode group 7 is provided at a position adjacent to the processing solution nozzle 4 in the movement direction D1, and is provided on both sides of the processing solution nozzle 4 in the movement direction D1 in the illustrated example.

Figure 5:
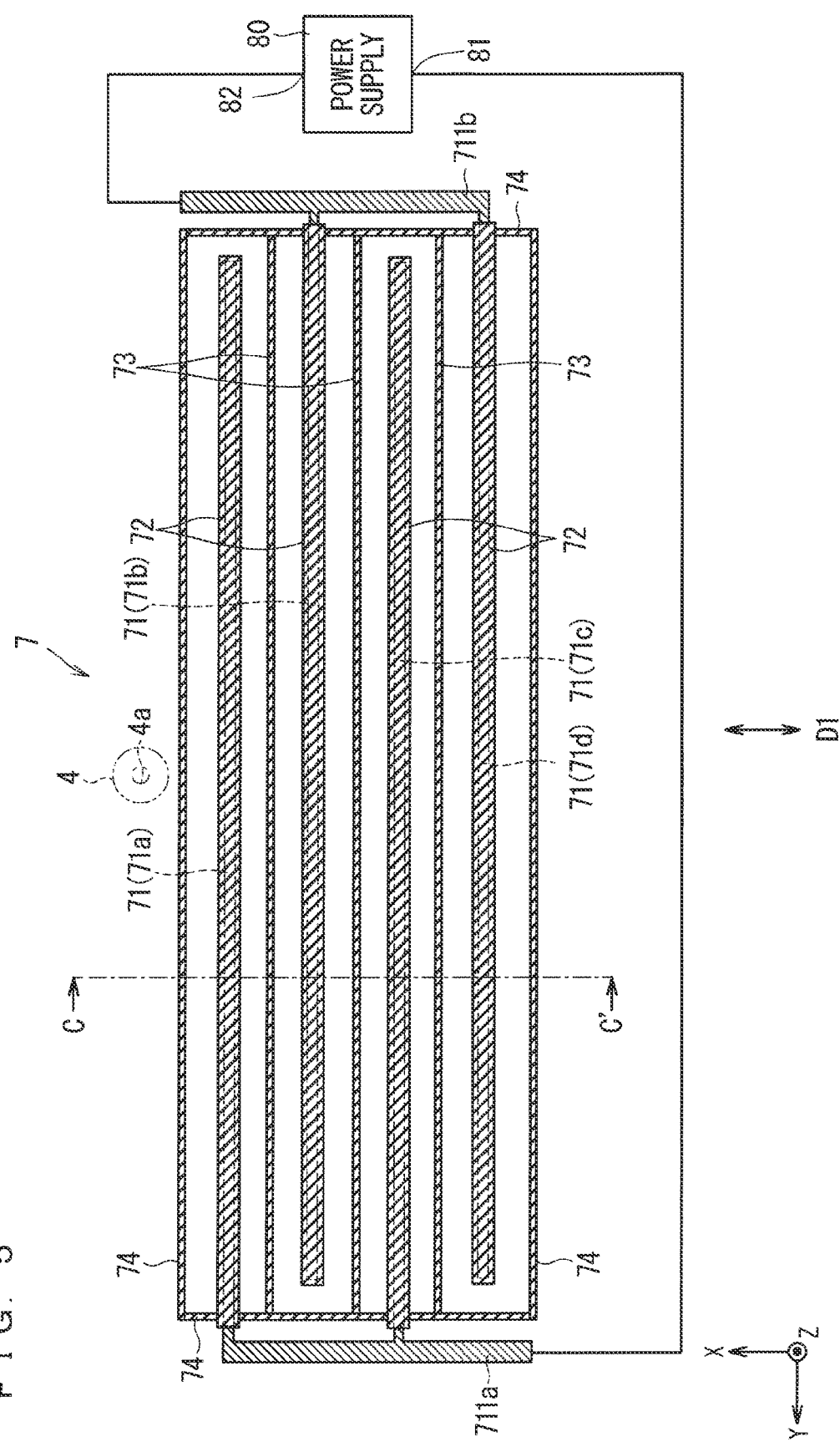
FIG. 5 is a plan view illustrating an example of a configuration of an electrode group.
Figure 6:
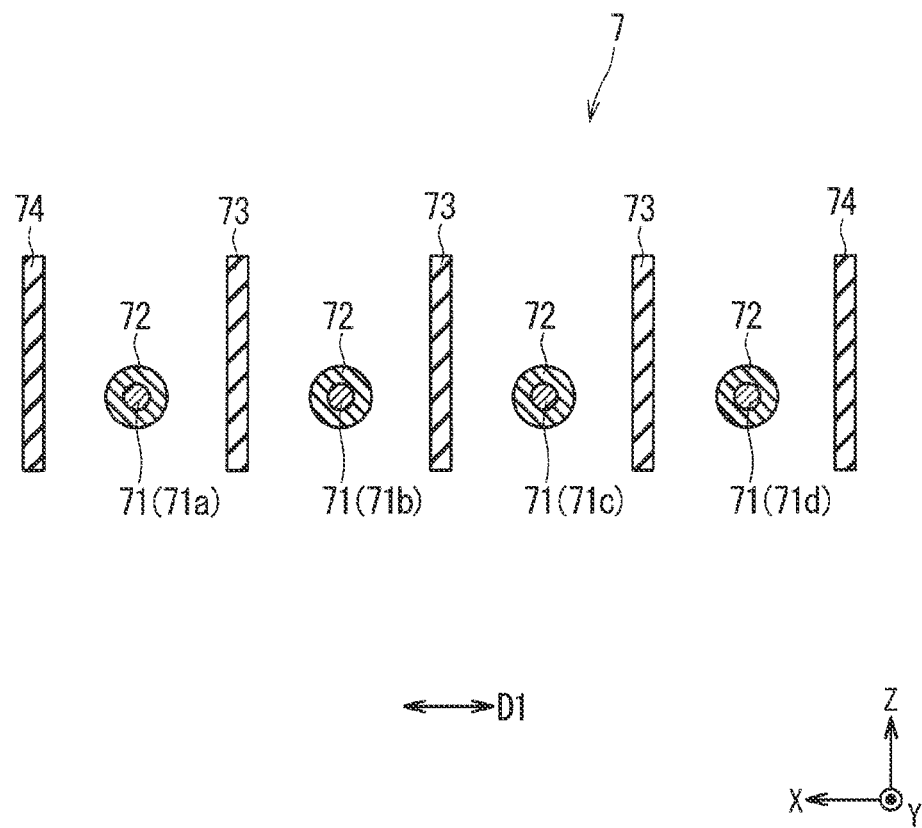
FIG. 6 is a cross-sectional view corresponding to a C-C' cross section in FIG. 5.

FIGS. 5 and 6 are diagrams schematically illustrating an example of a configuration of the electrode group 7. FIG. 5 is a plan view illustrating an example of the configuration of the electrode group 7, and FIG. 6 is a cross-sectional view corresponding to the C-C' cross section in FIG. 5. Hereinafter, the electrode group 7 will be described with reference to FIGS. 5 and 6.

The electrode group 7 includes a plurality of electrodes 71. The plurality of electrodes 71 are formed of a conductor such as metal, and are arranged side by side at an interval at positions not overlapping with the processing solution nozzle 4 in plan view. In the example illustrated in FIG. 5, each electrode 71 has an elongated shape elongated in the horizontal direction. The elongated shape herein refers to a shape in which in the longitudinal direction (Y-axis direction in FIG. 5) of the size of the electrode 71 is longer than the size in the horizontal direction orthogonal to the longitudinal direction. In the illustrated example, the plurality of electrodes 71 are orientated to have the longitudinal direction extending orthogonal to the movement direction D1.

The plurality of electrodes 71 are arranged side by side at an interval in a horizontal arrangement direction (here, the movement direction D1) orthogonal to the longitudinal direction thereof. In the illustrated example, four electrodes 71a, 71b, 71c, and 71d are illustrated as the plurality of electrodes 71. The electrode 71a, the electrode 71b, the electrode 71c, and the electrode 71d are arranged in this order from one side to the other side in the arrangement direction. The electrode 71a, the electrode 71b, the electrode 71c, and the electrode 71d are arranged, for example, in the same plane.

Potentials of different polarities are applied to two adjacent ones of the plurality of electrodes 71. In the example illustrated in FIG. 5, the electrodes 71a and 71c which are odd number ones in the order of arrangement from one side in the arrangement direction are connected to an output end 81 of a power supply 80, and the electrodes 71b and 71d that are even number ones in the order of arrangement are connected to an output end 82 of the power supply 80.

In the example illustrated in FIG. 5, the electrode 71a and the electrode 71c are coupled to each other via a coupling portion 711a at one side end portion in the longitudinal direction. The coupling portion 711a has, for example, a plate shape, and is integrally formed of, for example, the same material as the electrode 71a and the electrode 71c.

The electrode 71b and the electrode 71d are coupled to each other via a coupling portion 711b at the other side end portion in the longitudinal direction. The coupling portion 711b has, for example, a plate shape, and is integrally formed of, for example, the same material as the electrode 71b and the electrode 71d.

With this configuration, the plurality of electrodes 71 are arranged to be in a comb shape. The coupling portion 711a is connected to the output end 81 of the power supply 80 via a lead wire, and the coupling portion 711b is connected to the output end 82 of the power supply 80 via a lead wire.

The power supply 80 includes, for example, a switching power supply circuit (for example, an inverter circuit) and is controlled by the control unit 90. The power supply 80 applies a voltage (for example, high frequency voltage) between the output end 81 and the output end 82. As a result, an electric field is generated in a space (electric field space) between the plurality of electrodes 71.

Since the electrode group 7 is positioned on the downstream side of the gas flow path 60, the gas flowing along the gas flow path 60 passes through the electric field space between the plurality of electrodes 71. When the gas passes through the electric field space, the electric field acts on the gas, and a part of the gas is ionized, whereby plasma is generated. This generation of the plasma involves generation of various active species. These active species move toward the upper surface of the substrate W along the gas flow (plasma processing).

The distance between the electrode group 7 and the substrate W is set to a distance involving no arc discharge between the electrode group 7 and the substrate W. The distance between the electrode group 7 and the substrate W is set to be, for example, 2 mm or more and 5 mm or less.

The width of the electrode group 7 in the direction orthogonal to the movement direction D1 (here, the length of the electrode 71 in the longitudinal direction) is larger than the width of the ejection port 4a of the processing solution nozzle 4 (see FIG. 5), and is for example, equal to or larger than the radius of the substrate W, and more desirably equal to or larger than the diameter of the substrate W. With this configuration, plasma can be generated in a wider range with respect to the substrate W in plan view, and the active species can be supplied over a wider range with respect to the upper surface of the substrate W.

Note that the shape of the electrode group is not limited to the comb shape as illustrated in the examples in FIGS. 5 and 6. For example, an electrode pair arranged with an electric field space interposed therebetween in plan view may be provided. Furthermore, electrodes with the respective polarities illustrated in the examples in FIGS. 5 and 6 may be arranged with a plate-shaped dielectric interposed therebetween in the Z direction, to generate an electric field space along the surface of the plate-shaped dielectric.

<Dielectric Protection Member>

In the illustrated example, each of the electrodes 71 is covered by a dielectric protection member 72. The dielectric protection member 72 is formed of, for example, an insulator (dielectric) such as quartz or ceramics, and covers a surface of the electrode 71. For example, the dielectric protection member 72 is in close contact with the surface of the electrode 71. The dielectric protection member 72 may be a dielectric film formed on the surface of the electrode 71. The dielectric protection member 72 can protect the electrode 71 from plasma.

In the example illustrated in FIG. 6, each electrode 71 has a circular cross-sectional shape, and each dielectric protection member 72 has an annular cross-sectional shape.

<Dielectric Partition Member>

In the illustrated example, a dielectric partition member 73 is provided between two adjacent electrodes 71. Specifically, the dielectric partition member 73 is provided between each two of the plurality of electrodes 71. The dielectric partition member 73 is formed of, for example, an insulator (dielectric) such as quartz or ceramics, and is provided while being spaced apart from each electrode 71. The dielectric partition member 73 has, for example, a plate shape, and is orientated to have the thickness direction extending along the arrangement direction (here, the movement direction D1) of the electrodes 71. The upper surface of the dielectric partition member 73 has, for example, a rectangular shape elongated in the longitudinal direction of the electrode 71.

In the example illustrated in FIG. 6, the upper end of the dielectric partition member 73 is positioned above the upper end of the electrode 71, and the lower end of the dielectric partition member 73 is located below the lower end of the electrode 71. Considering the production tolerance and the like, for example, the lowest upper end position of the plurality of dielectric partition members 73 is set to be higher than the highest upper end position of the plurality of electrodes 71, and the highest lower end position of the plurality of dielectric partition members 73 is set to be lower than the lowest lower end position of the plurality of electrodes 71.

When such a dielectric partition member 73 is provided, the insulation distance between the plurality of electrodes 71 can be increased. This makes it possible to suppress the occurrence of arc discharge between the plurality of electrodes 71 while increasing the voltage of the plurality of electrodes 71 to more efficiently generate plasma.

<Frame Body>

In the example illustrated in FIG. 5, the dielectric partition member 73 is coupled to the frame body 74. The frame body 74 is formed of, for example, an insulator (dielectric) such as quartz or ceramics, and has, for example, a rectangular ring shape in plan view.

The frame body 74 surrounds the plurality of dielectric partition members 73 in plan view, and both ends of each dielectric partition member 73 in the longitudinal direction are coupled to the inner surface of the frame body 74.

The frame body 74 also substantially surrounds the plurality of electrodes 71. In the example illustrated in FIG. 5, the coupling portion 711a and the coupling portion 711b are positioned more on the outer side than the frame body 74, the electrode 71a and the electrode 71c have one side in the longitudinal direction provided through the frame body 74 to be coupled to the coupling portion 711a, and the electrode 71b and the electrode 71c have the other sides in the longitudinal direction provided through the frame body 74 to be coupled to the coupling portion 711b.

In the example illustrated in FIG. 5, the electrodes 71 are mainly positioned inside the frame body 74, and the electric field space is formed inside the frame body 74 in plan view. The frame body 74 is coupled to, for example, a lower end of the side wall portion 62 of the unit body 6.

The gas passes through the electrode group 7 in the frame body 74. Specifically, the gas passes downward through the space between the plurality of electrodes 71 and the plurality of dielectric partition members 73. When an electric field generated in an electric field space between the plurality of electrodes 71 acts on the gas, a part of the gas is ionized, whereby plasma is generated. The generation of plasma involves generation of various active species. These active species move downward along the gas flow and flow out toward the upper surface of the substrate W (plasma processing).

As described above, the nozzle head 3 can supply the processing solution and the gas onto the upper surface of the substrate W using the processing solution nozzle 4 and the plasma generation unit 5.

<Operation of Processing Unit>

Figure 7:
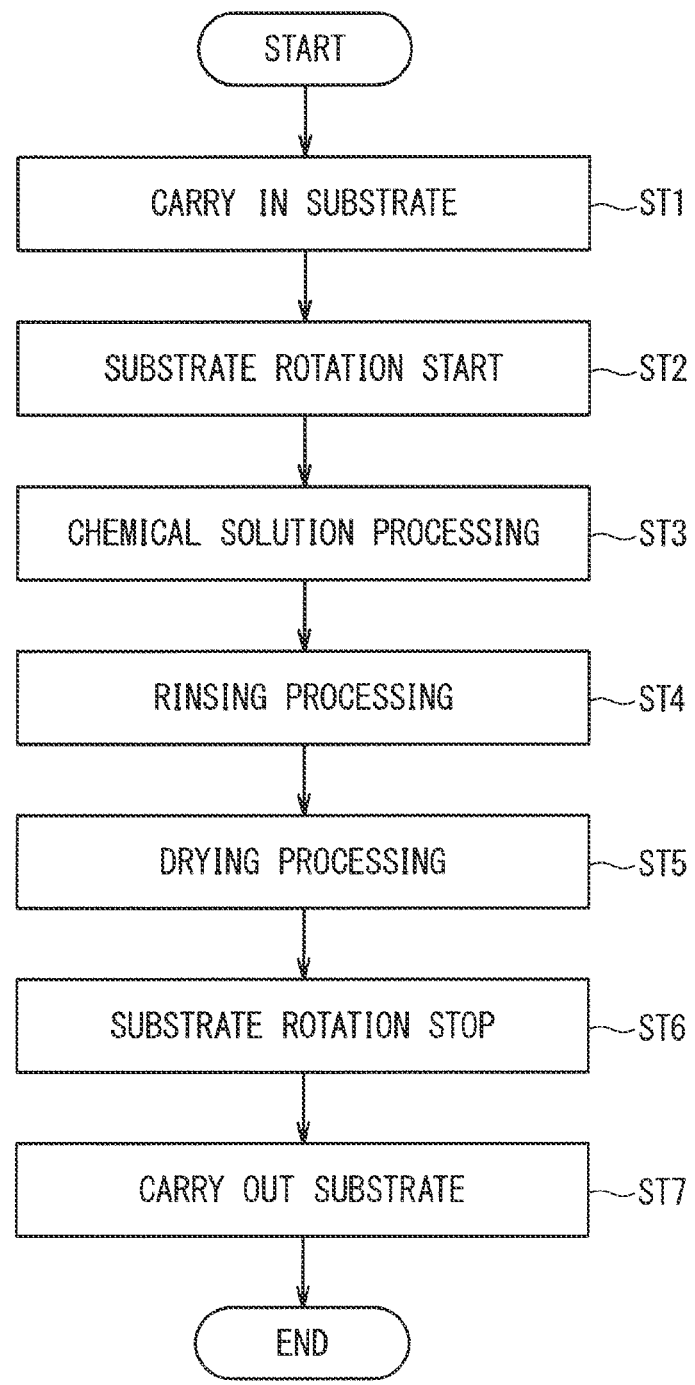
FIG. 7 is a flowchart illustrating an example of the operation of the processing unit.

Next, an example of the operation of the processing unit 600 in the substrate processing apparatus will be described. FIG. 7 is a flowchart illustrating an example of the operation of the processing unit 600.

First of all, the center robot 603 carries the substrate W to be processed is carried into the processing unit 600 (step ST1). Here, a resist is formed on the upper surface of the substrate W. The substrate holding unit 2 of the processing unit 600 holds the substrate W thus carried in.

Next, the substrate holding unit 2 starts rotating the substrate W about the rotation axis Q1 (step ST2).

Next, chemical solution processing is executed (step ST3). Specifically, first, the head moving mechanism 30 moves the nozzle head 3 from the standby position to the processing position. Next, the valve 46, the valve 52a, and the valve 52b are opened, the power supply 80 applies voltage to the electrode 71, and the head moving mechanism 30 moves the nozzle head 3 back and forth along the movement direction D1 (what is known as scan processing). For example, the head moving mechanism 30 moves the nozzle head 3 back and forth between the first circumference edge position and the second circumference edge position.

When the valve 46 opens, the processing solution (here, chemical solution such as sulfuric acid) is discharged from the ejection port 4a of the processing solution nozzle 4 toward the upper surface of the substrate W. The chemical solution attached to the upper surface of the rotating substrate W flows radially outward along the upper surface of the substrate W and scatters outward from the circumference edge of the substrate W.

When the valve 52a and the valve 52b are opened, gas (here, which is a mixture of oxygen-containing gas and rare gas) is supplied from the gas supply unit 50 to the gas flow path 60 through the inlet 611. More specifically, the gas is flows into the divided gas flow path 60a, the divided gas flow path 60b, the divided gas flow path 60c, and the divided gas flow path 60d respectively through the inlet 611a, the inlet 611b, the inlet 611c, and the inlet 611d.

Here, the gas is supplied at a first flow rate to the divided gas flow path 60a and the divided gas flow path 60d far from the processing solution nozzle 4, and the gas is supplied at a second flow rate, higher than the first flow rate, to the divided gas flow path 60b and the divided gas flow path 60c close to the processing solution nozzle 4.

The gas flowing downward through the divided gas flow path 60a and the divided gas flow path 60b passes through the plurality of openings 641 of the plate-like body 64a. As a result, the gas is rectified and flows toward the electrode group 7a more uniformly. Similarly, the gas flowing downward through the divided gas flow path 60c and the divided gas flow path 60d passes through the plurality of openings 641 of the plate-like body 64b. As a result, the gas is rectified and flows toward the electrode group 7b more uniformly.

Since the power supply 80 applies a voltage to the electrode 71, an electric field is generated in the electric field space between the electrodes 71 in the electrode group 7a and the electrode group 7b. When the gas passes through the electric field space, an electric field acts on the gas, and a part of the gas is ionized, whereby plasma is generated. The generation of plasma leads to various reactions such as dissociation and excitation of molecules and atoms due to electron collision reaction, and also leads to generation of various active species such as highly reactive neutral radicals (for example, oxygen radical). For example, argon gas turns into plasma due to an electric field, and the plasma acts on the oxygen-containing gas, whereby the oxygen radical is generated. These active species (for example, oxygen radical) move along the gas flow and flow out toward the upper surface of the substrate W (plasma processing).

The active species act on the chemical solution on the upper surface of the substrate W. For example, when the oxygen radical acts on sulfuric acid on the upper surface of the substrate W, peroxo-monosulfuric acid (caroic acid) is generated by the oxidizing power of the oxygen radical. Here, in the case of using a processing solution containing sulfuric acid, a higher concentration of the sulfuric acid is expected to provide higher peeling force, and is preferably in a range of 94% or more and 98% or less, and a concentration of sulfuric acid closer to 98% is more preferable for example. With caroic acid, the resist on the upper surface of the substrate W can be effectively removed. In other words, the active species acting on the chemical solution results in improvement of the processing performance of the chemical solution.

The active species can not only act on the chemical solution on the upper surface of the substrate W but can also act directly on the substrate W. For example, also in a case where the oxygen radical directly acts on the resist of the substrate W, the resist can be removed by the oxidizing power of the oxygen radical.

When the resist on the substrate W is sufficiently removed, the valve 46, the valve 52*a*, and the valve 52*b* are closed, and the power supply 80 stops outputting the voltage. As a result, the ejection of the chemical solution from the processing solution nozzle 4 stops, and the outflow of the gas from the plasma generation unit 5 also stops. The head moving mechanism 30 stops the back and forth movement of the nozzle head 3. As a result, the chemical solution processing (here, resist removal processing) is substantially completed.

Next, rinsing processing is executed (step ST4). Specifically, for example, the head moving mechanism 30 moves the nozzle head 3 to make the processing solution nozzle 4 face the center portion of the substrate W, and the processing unit 600, for example, ejects rinse liquid from the processing solution nozzle 4 toward the upper surface of the substrate W. As a result, the chemical solution on the upper surface of the substrate W is replaced with the rinse liquid. The head moving mechanism 30 may move the nozzle head 3 back and forth also in the rinsing processing (what is known as the scan processing).

When the chemical solution on the upper surface of the substrate W is sufficiently replaced with the rinse liquid, the ejection of the rinse liquid from the processing solution nozzle 4 stops, and the head moving mechanism 30 moves the nozzle head 3 to the standby position.

Here, as will be described in detail later, the nozzle head 3 executes the plasma processing for each of a first supply setting and a second supply setting. The first supply setting is for supplying the chemical solution such that the thickness of the liquid film positioned below the nozzle head 3 becomes a first thickness (for example, 0.1 mm or more and less than 0.25 mm). The second supply setting is for supplying the chemical solution such that the thickness of the liquid film of the chemical solution formed on the upper surface of the substrate W becomes a second thickness (for example, 0.35 mm or more and 2 mm or less) that is larger than the first thickness.

The two types of plasma processing may be continuously executed in step ST3. Alternatively, after one plasma processing is executed in step ST3 and the rinsing processing (step ST4) is executed, the processing may return to step ST3 and the other plasma processing and the rinsing processing may be executed (step ST4).

Next, drying processing is executed (step ST5). For example, the substrate holding unit 2 increases the rotation speed of the substrate W. As a result, the rinse liquid on the upper surface of the substrate W is shaken off from the circumference edge of the substrate W, and the substrate W is dried (what is known as spin drying).

When the substrate W is dried, the substrate holding unit 2 stops the rotation of the substrate W (step ST6). Next, the center robot 603 carries out the processed substrate W from the processing unit 600 (step ST7).

<Specific Method of Chemical Solution Processing>

As described above, in the present preferred embodiment, a resist pattern is formed on the upper surface of the substrate W such as a semiconductor wafer. As the resist, a high-dose resist with a large dose amount (for example, the ion implantation amount of As is $1 \times 10^{15}$ [/cm$^2$] or the like) may be used.

Here, the resist pattern formed on the upper surface of the substrate W has high and low density parts, and the shape of a cured layer formed along the pattern on the upper surface of the resist tends to be complicated in the high density part of the pattern.

According to the experiments by the inventors, it has been found that, when the chemical solution on which the active species acts is supplied to the upper surface of the substrate W, the removal amount of the resist changes depending on the thickness of the liquid film of the chemical solution formed to cover the resist on the upper surface of the substrate W.

Specifically, it has been found that when the density of the resist pattern formed on the upper surface of the substrate W is relatively high, the removal amount of the resist is large when the liquid film of the chemical solution is relatively thin, whereas when the density of the resist pattern formed on the upper surface of the substrate W is relatively low, the removal amount of the resist is large when the liquid film of the chemical solution is relatively thick.

Regarding the above, in a case where the density of the pattern of the resist formed on the upper surface of the substrate W is relatively high, if the liquid film of the chemical solution is thin, the active species in the liquid film efficiently reach the cured layer formed in a complicated shape and the fine gap of the resist. This is expected to result in a large removal amount of the resist.

On the other hand, in a case where the density of the resist pattern formed on the upper surface of the substrate W is relatively low, if the liquid film of the chemical solution is thick, the amount of the chemical solution in which the resist is dissolved increases. This is expected to result in a large removal amount of the resist.

In view of the above, in the chemical solution processing of the present preferred embodiment, each of the first supply setting for supplying the chemical solution so that the liquid film of the chemical solution formed on the upper surface of the substrate W has the first thickness (For example, 0.1 mm or more and less than 0.25 mm) and the second supply setting for supplying the chemical solution so that the liquid film of the chemical solution formed on the upper surface of the substrate W has the second thickness (For example, 0.35 mm or more and 2 mm or less) that is larger than the first thickness is set. For each supply setting, the control unit 90 adjusts the amount of the chemical solution supplied from the processing solution supply source 47 (see FIG. 3), the rotation speed of the substrate W, and the like such that the thickness of the liquid film to be formed becomes the first thickness or the second thickness.

The first thickness which a relatively small thickness of the liquid film of the chemical solution involves a risk that the gas blown onto the liquid film may cause variation in the thickness of the liquid film varies, formation of a hole in the liquid film, or the like. Therefore, the inflow speed of the gas into each of the divided gas flow path 60*a*, the divided gas flow path 60*b*, the divided gas flow path 60*c*, and the divided gas flow path 60*d* is desirably set to be lower than the inflow speed of the gas for the second thickness.

Note that the thickness of the liquid film formed by the chemical solution supplied under the first supply setting includes, for example, a case where the average value of the thicknesses of the entire liquid film formed on the upper surface of the substrate W is the first thickness. Similarly, the thickness of the liquid film formed by the chemical solution supplied under the second supply setting includes, for example, a case where the average value of the thicknesses of the entire liquid film formed on the upper surface of the substrate W is the second thickness.

Then, the chemical solution is supplied under the first supply setting to a region of the resist pattern on the upper surface of the substrate W where the density is relatively high. Thus, a liquid film having the first thickness is formed.

On the other hand, the chemical solution is supplied under the second supply setting to a region of the resist pattern where the density is relatively low. Thus, a liquid film having the second thickness is formed.

Figure 8:
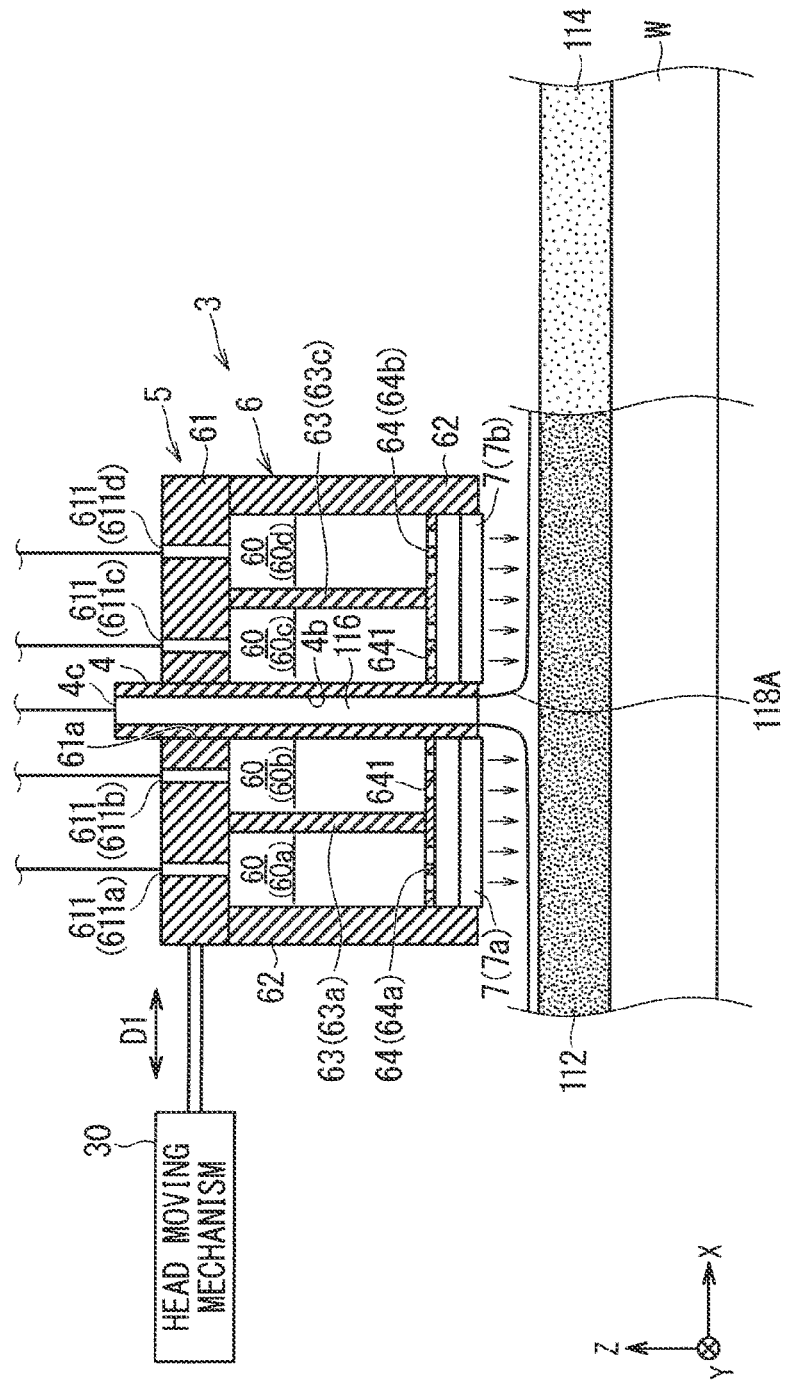
FIG. 8 is a diagram illustrating an example of a liquid film formed on the upper surface of a substrate during chemical solution processing.

FIG. 8 is a diagram illustrating an example of a liquid film formed on the upper surface of the substrate W during the chemical solution processing. As illustrated in FIG. 8 as an example, a resist 112 and a resist 114 are formed on the upper surface of the substrate W. The density of the pattern of the resist 112 is assumed to be relatively high, and the density of the pattern of the resist 114 is assumed to be relatively low (at least lower than the density of the pattern of the resist 112.). Here, the resist 112 and the resist 114 may be formed apart from each other or may be continuously formed on the upper surface of the substrate W.

In FIG. 8, it is assumed that a chemical solution 116 is ejected to at least a region on the upper surface of the substrate W where the resist 112 is formed, to form a liquid film 118A and mainly remove the resist 112.

In this case, since the density of the pattern of the resist 112 is relatively high, the chemical solution 116 is supplied under the first supply setting to reduce the thickness of the liquid film 118A (that is, to be the first thickness).

Gas is supplied from the gas supply unit 50 (see FIG. 3), and plasma is generated in the gas by the electrode 71. Then, active species and the like generated by the plasma conversion are supplied to the liquid film 118A (plasma processing). The active species acting on the chemical solution results in improvement of the processing performance (specifically, the removal performance for the resist 112 including the cured layer formed on the upper surface of the resist 112) of the chemical solution.

Figure 9:
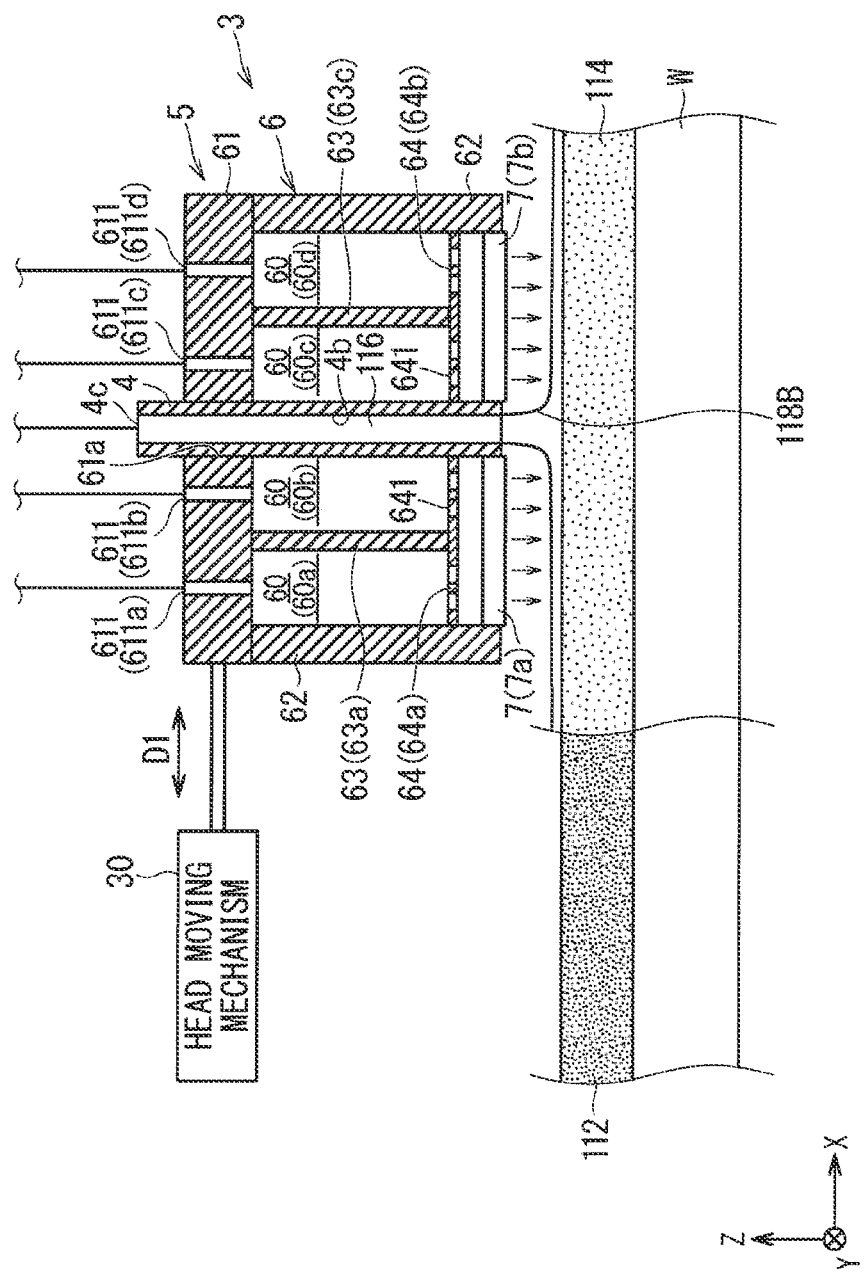
FIG. 9 is a diagram illustrating an example of a liquid film formed on the upper surface of the substrate during the chemical solution processing.

FIG. 9 is a diagram illustrating an example of a liquid film formed on the upper surface of the substrate W during the chemical solution processing. In FIG. 9, it is assumed that a chemical solution 116 is ejected to at least a region on the upper surface of the substrate W where the resist 114 is formed, to form a liquid film 118B and mainly remove the resist 114.

In this case, since the density of the pattern of the resist 114 is relatively low, the chemical solution 116 is supplied under the second supply setting to increase the thickness of the liquid film 118B (that is, to be the second thickness).

Gas is supplied from the gas supply unit 50 (see FIG. 3), and plasma is generated in the gas by the electrode 71. Then, active species and the like generated by the plasma conversion are supplied to the liquid film 118B (plasma processing). The active species acting on the chemical solution results in improvement of the processing performance (specifically, the removal performance for the resist 114 including the cured layer formed on the upper surface of the resist 114) of the chemical solution.

The modes illustrated in FIGS. 8 and 9 may be sequentially implemented by the head moving mechanism 30 moving the nozzle head 3, or may be simultaneously implemented using a plurality of the nozzle heads 3. In other words, the resist 112 may be mainly removed under the second supply setting after the resist 114 is mainly removed under the first supply setting. The resist 114 may be mainly removed under the first supply setting after the resist 112 is mainly removed under the second supply setting. The removal of the resist 112 under the first supply setting and the removal of the resist 114 under the second supply setting may be concurrently performed.

In the examples illustrated in FIGS. 8 and 9, the liquid film 118A having the first thickness is formed by supplying the chemical solution 116 under the first supply setting to a region where the density of the resist pattern is relatively high (that is, the region where the resist 112 is formed), and the liquid film 118B having the second thickness is formed by supplying the chemical solution 116 under the second supply setting to a region where the density of the resist pattern is relatively low (that is, the region where the resist 114 is formed).

However, the region to which the chemical solution 116 is supplied under the first supply setting and the region to which the chemical solution 116 is supplied under the second supply setting are not limited to the regions distinguished by the density of the resist pattern. Thus, the regions may be distinguished by a reference (For example, a distance from the center portion of the substrate W, and the like) different from the density of the resist pattern.

Furthermore, the region to which the chemical solution 116 is supplied under the first supply setting and the region to which the chemical solution 116 is supplied under the second supply setting may at least partially overlap.

Figure 10:
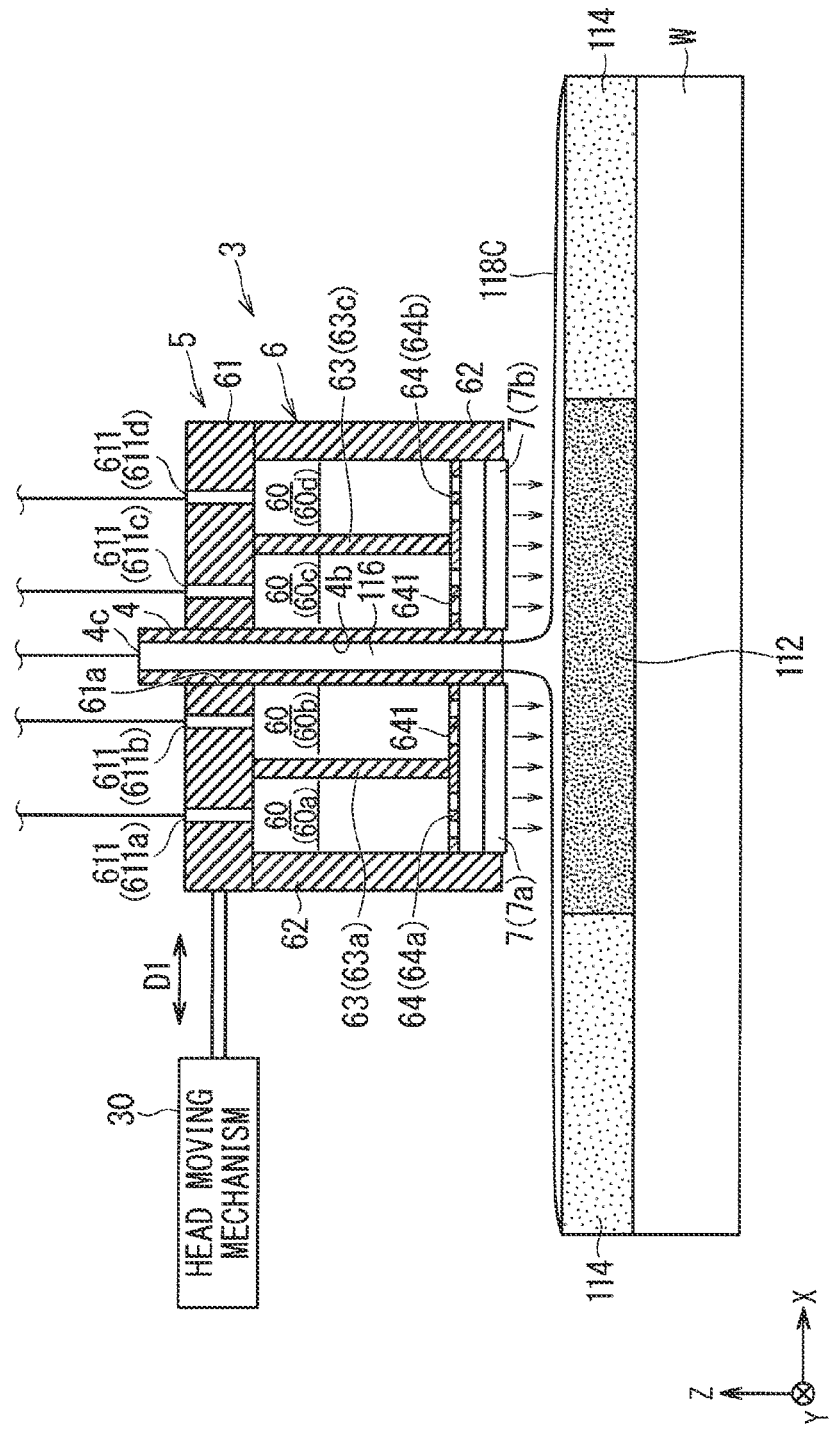
FIG. 10 is a diagram illustrating another example of a liquid film formed on the upper surface of the substrate during the chemical solution processing.

FIG. 10 is a diagram illustrating another example of a liquid film formed on the upper surface of the substrate W during the chemical solution processing. As illustrated in FIG. 10 as an example, the resist 112 and the resist 114 are formed on the upper surface of the substrate W. As in the case described above, the density of the pattern of the resist 112 is assumed to be relatively high, and the density of the pattern of the resist 114 is assumed to be relatively low (at least lower than the density of the pattern of the resist 112.).

In FIG. 10, it is assumed that a chemical solution 116 is ejected over the entirety of the upper surface of the substrate W, to form a liquid film 118C and mainly remove the resist 112. When the liquid film 118C is formed over the entirety of the upper surface of the substrate W, the head moving mechanism 30 may execute the scan processing of moving the nozzle head 3 back and forth.

In this case, since the density of the pattern of the resist 112 is relatively high, the chemical solution 116 is supplied under the first supply setting to reduce the thickness of the liquid film 118C (that is, to be the first thickness).

Gas is supplied from the gas supply unit 50 (see FIG. 3), and plasma is generated in the gas by the electrode 71. Then, active species and the like generated by the plasma conversion are supplied to the liquid film 118C.

FIG. 11 is a diagram illustrating another example of a liquid film formed on the upper surface of the substrate W during the chemical solution processing. In FIG. 11, it is assumed that a chemical solution 116 is ejected over the entirety of the upper surface of the substrate W, to form a liquid film 118D and mainly remove the resist 114, after the chemical solution processing has been executed while forming the liquid film 118C as in the example illustrated in FIG. 10. When the liquid film 118D is formed over the entirety of the upper surface of the substrate W, the head moving mechanism 30 may execute the scan processing of moving the nozzle head 3 back and forth.

In this case, since the density of the pattern of the resist 114 is relatively low, the chemical solution 116 is supplied under the second supply setting to increase the thickness of the liquid film 118D (that is, to be the second thickness).

Gas is supplied from the gas supply unit 50 (see FIG. 3), and plasma is generated in the gas by the electrode 71. Then, active species and the like generated by the plasma conversion are supplied to the liquid film 118D.

FIGS. 10 and 11 illustrate a case where the region to which the chemical solution 116 is supplied under the first supply setting and the region to which the chemical solution 116 is supplied under the second supply setting are both the entire upper surface of the substrate W. The region to which the chemical solution 116 is supplied under the first supply setting and the region to which the chemical solution 116 is supplied under the second supply setting may not be the entire upper surface of the substrate W, as long as the regions at least partially overlap.

With the chemical solution processing executed in the order as described above, active species and the like generated by the plasma generation are first supplied to the liquid film 118C having the first thickness, and then the cured layer on the upper surface of the resist 112 and the upper surface of the resist 114 can be efficiently removed while suppressing damage to the upper surface of the substrate W. Next, the resist 112 and the resist 114 partially exposed by the removal of the cured layer can be efficiently removed by supplying active species and the like generated by the plasma generation to the liquid film 118D having the second thickness. Note that, in a state where the liquid film 118D having the second thickness is formed, the flow rate of the chemical solution 116 increases so that the resist 112 and the resist 114 can be washed away, whereby the resist 112 and the resist 114 can be prevented from remaining on the upper surface of the substrate W.

Note that the order of the processing in FIGS. 10 and 11 may be reversed. Specifically, the liquid film 118C having the first thickness may be formed and the chemical solution processing may be executed, after the liquid film 118D having the second thickness has been formed and the chemical solution processing has been executed.

In the above preferred embodiment, the plasma generation unit 5 moves in conjunction with the processing solution nozzle 4. Alternatively, the plasma generation unit 5 may be provided independently from the processing solution nozzle 4, and may move independently from the movement of the processing solution nozzle 4. In this case, the plasma processing by the plasma generation unit 5 may be executed after the processing solution nozzle 4 has moved from the processing position to the standby position.

The region covered by the plasma generation unit 5 may be a region corresponding to a part of the upper surface of the substrate W as illustrated in FIG. 3 and the like, or may be a region corresponding to the entire upper surface of the substrate W.

In the processing unit 600, the processing solution nozzle 4 and the plasma generation unit 5 are disposed adjacent to each other in plan view. Therefore, the gas from the plasma generation unit 5 is supplied to the processing solution ejected from the processing solution nozzle 4 and deposited on the upper surface of the substrate W. Then, the active species can act on the processing solution on the upper surface of the substrate W.

Therefore, the processing performance of the processing solution on the upper surface of the substrate W can be improved. With the processing solution acting on the upper surface of the substrate W with the improved processing performance, the substrate W can be processed in a shorter period of time. The active species may directly act on the upper surface of the substrate W, and thus the substrate W can be processed in a short period of time.

In the above example, the plurality of electrodes 71 of the electrode group 7 are arranged side by side in plan view. For example, a plurality of electrodes 71 having an elongated shape elongated in the horizontal direction are arranged side by side at an interval in the lateral direction (arrangement direction) thereof.

With this configuration, the area of the electrode group 7 in plan view can be easily increased. Therefore, plasma can be generated in a wide range in plan view, and active species can be supplied over a wide range on the upper surface of the substrate W. Therefore, the substrate W can be more uniformly processed.

In the above example, the gas flow path 60 and the electrode group 7 are provided at positions adjacent to the processing solution nozzle 4 in the movement direction D1 of the nozzle head 3, and more specifically, are provided on both sides for example. As a result, active species are supplied to the upper surface of the substrate W on both sides of the processing solution nozzle 4 in the movement direction D1.

Here, regions to which the active species is supplied are present on both side of the processing solution nozzle 4 in plan view. Such regions are referred to as outflow regions. With this configuration, during the back and forth movement of the nozzle head 3, immediately after the processing solution nozzle 4 has ejected the processing solution, one of the outflow regions quickly reaches the discharge position. Therefore, the active species can act more quickly on the processing solution that has been deposited on the upper surface of the substrate W and on which the active species have not yet acted. As a result, the processing time for the substrate W can be shortened.

In the above example, the plate-like body 64 having the plurality of openings 641 is provided on the upstream side of the electrode group 7. With this configuration, the gas that has passed through the plurality of openings 641 uniformly passes through the electrode group 7. Therefore, the gas uniformly passes through the electric field space, and plasma is uniformly generated. As a result, the active species can be uniformly generated and uniformly supplied onto the upper surface of the substrate W. Therefore, the substrate W can be uniformly processed.

In the above example, the flow path partition portions 63 are provided to divide the gas flow path 60 into the divided gas flow path 60a, the divided gas flow path 60b, the divided gas flow path 60c, and the divided gas flow path 60d in the movement direction D1. With this configuration, the flow rates of the gas in the divided gas flow path 60a, the divided gas flow path 60b, the divided gas flow path 60c, and the divided gas flow path 60d can be adjusted. For example, the flow rates in the divided gas flow path 60a, the divided gas flow path 60b, the divided gas flow path 60c, and the divided gas flow path 60d can be adjusted such that the gas flows in the divided gas flow path 60b and the divided gas flow path 60c close to the processing solution nozzle 4 at a higher flow velocity than that of the gas flowing in the divided gas flow path 60a and the divided gas flow path 60d far from the processing solution nozzle 4.

It is a known fact that active species such as oxygen radicals are deactivated in a short time. Therefore, a lower flow velocity of the gas leads to a higher risk of the active species being deactivated before reaching the upper surface of the substrate W. When the flow velocity of the gas in the divided gas flow path 60b and the divided gas flow path 60c is high as described above, many active species can reach the upper surface of the substrate W at a position close to the processing solution nozzle 4. On the other hand, since the flow velocity of the gas in the divided gas flow path 60a and the divided gas flow path 60d is relatively low, the amount of active species reaching the upper surface of the substrate W is small at a position far from the processing solution nozzle 4.

Thus, many active species can act on the processing solution ejected from the processing solution nozzle 4 and deposited at the position close to the processing solution nozzle 4 on the upper surface of the substrate W. On the other hand, at a position far from the processing solution nozzle 4 in the upper surface of the substrate W, a small amount of active species acts on the processing solution to which the active species have already been supplied at a position close to the processing solution nozzle 4.

With the amount of the active species acting thus adjusted based on the distance from the processing solution nozzle 4, the substrate W can be uniformly processed with the processing solution. Furthermore, the gas consumption amount can be reduced as compared with the case where the gas is supplied at a high flow velocity in all of the divided gas flow paths 60a, the divided gas flow path 60b, the divided gas flow path 60c, and the divided gas flow path 60d.

In the above example, the dielectric partition member 73 is provided between the electrodes 71. With this configuration, it is possible to suppress the arc discharge between the electrodes 71 while increasing the voltage applied to the electrodes 71 to promote the generation of plasma.

Second Preferred Embodiment

Figure 12:
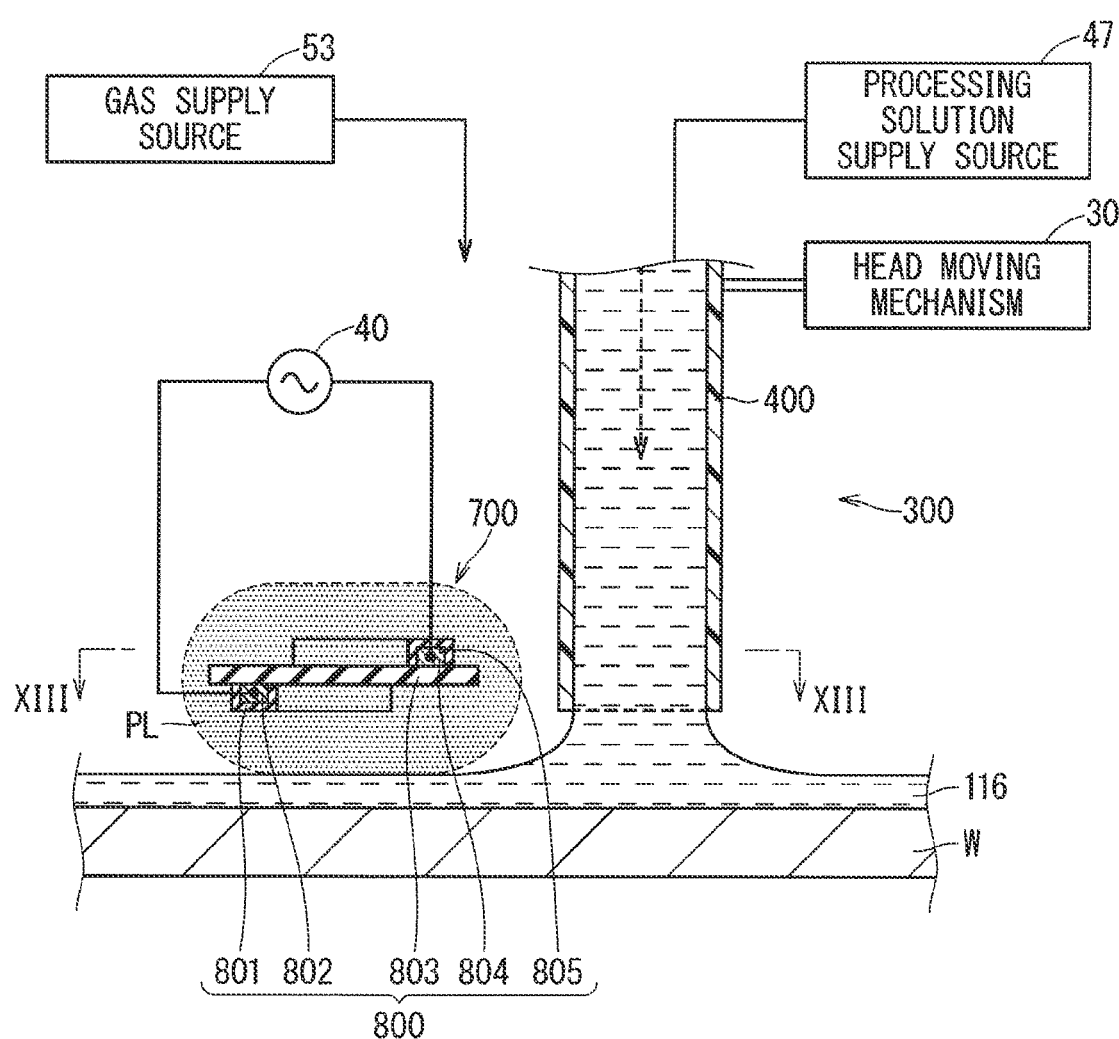
FIG. 12 is a side view schematically illustrating an example of a configuration of a nozzle head according to a second preferred embodiment.

FIG. 12 is a side view schematically illustrating an example of a configuration of a nozzle head 300 according to a second preferred embodiment. FIG. 13 is a plan view schematically illustrating an example of a configuration of the nozzle head 300 according to the second preferred embodiment. FIG. 13 corresponds to a partial cross-sectional view taken along line XIII-XIII in FIG. 12.

Note that, in the second preferred embodiment, the configurations common to those in the first preferred embodiment are respectively denoted with the same reference numerals as those in FIGS. 1 to 11, and a detailed description thereof will be omitted.

The second preferred embodiment is mainly different from the first preferred embodiment in the following point. Specifically, the gas supplied from the gas supply source 53. which flows to the electrode group 7 (the electrode group 7a and the electrode group 7b) through the divided gas flow path 60a, the divided gas flow path 60b, the divided gas flow path 60c, and the divided gas flow path 60d in a nozzle head 3 in the first preferred embodiment. On the other hand, no divided gas flow path is provided above an electrode group 700 in the second preferred embodiment.

In the second preferred embodiment, the nozzle head 300 includes a processing solution nozzle 400 and the electrode group 700 provided adjacent to the processing solution nozzle 400.

The electrode group 700 includes a plasma source 800 and an AC power supply 40. The plasma source 800 includes a dielectric layer 803, an electrode 802, and an electrode 804. The plasma source 800 preferably includes an insulating cover portion 801 and an insulating cover portion 805.

The dielectric layer 803 has a lower surface facing the liquid film and an upper surface. The electrode 802 is disposed on the lower surface while being separated from the liquid film. The electrode 804 is disposed on the upper surface. As illustrated in FIG. 13, the electrode 802 and the electrode 804 are preferably a pair of comb-shaped electrodes that mesh with each other in a planar layout parallel to the dielectric layer 803. The insulating cover portion 801 covers the electrode 802 so as to separate the electrode 802 from a space where plasma PL is to be generated. The insulating cover portion 805 covers the electrode 804 so as to separate the electrode 804 from the space where plasma PL is to be generated.

Then, the gas supplied from the gas supply source 53 is supplied to fill the inside of the processing unit 600 on which the substrate W is placed, instead of being blown toward the electrode group 700. In order to efficiently fill the inside of the processing unit 600 with the gas, the processing unit 600 is desirably covered with a shielding plate (not illustrated) so that the substrate W and the nozzle head 300 are covered.

The head moving mechanism 30 can move the processing solution nozzle 400 and the electrode group 700 between a processing position and a retracted position on the substrate W. The processing solution nozzle 400 and the electrode group 700 may be configured to be movable on the substrate W by individual movement mechanisms.

Unlike the first preferred embodiment, the second preferred embodiment employs a configuration in which gas is not blown toward the liquid film on the substrate W, and thus is free of phenomena attributable to due to gas blowing such as thickness variation of the liquid film or formation of a hole in the liquid film. The configuration of the second preferred embodiment is desirable in a case where the liquid film is extremely thin or in a case where a slight variation of the liquid film would be a problem.

In the configuration of the second preferred embodiment, unlike the first preferred embodiment, the active species generated by the plasma generated in the vicinity of the electrode group 700 are not moved by the blown gas. Thus, the electrode group 700 and the liquid film on the substrate W is desirably arranged with a shortest possible distance therebetween involving no corona discharge between the substrate W and the electrode group 700.

<Modifications of Preferred Embodiments Described Above>

In the preferred embodiments described above, the material quality, material type, dimensions, shape, relative arrangement relationship, implementation condition, or the like of each component may also be described, but these are one example in all aspects and are not restrictive.

Accordingly, numerous modifications and equivalents, examples of which are not illustrated, are contemplated within the scope of the technology disclosed in the present specification. For example, a case of deforming, adding, or omitting at least one component is included.

In addition, in the preferred embodiments described above, in a case where a material name or the like is described without being particularly specified, the material includes other additives, for example, an alloy or the like, unless there is a contradiction.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method of removing a resist formed on an upper surface of a substrate from said upper surface of said substrate, said substrate processing method comprising:

forming a liquid film of a processing solution on said upper surface of said substrate by supplying said processing solution onto said upper surface of said substrate;

executing, under atmospheric pressure, plasma processing on said liquid film of said processing solution formed on said upper surface of said substrate, wherein said liquid film is formed at least in part of said upper surface of said substrate, and said liquid film has a first thickness; and executing, under atmospheric pressure, plasma processing on said liquid film of said processing solution formed on said upper surface of said substrate, wherein said liquid film is formed at least in part of said upper surface of said substrate, and said liquid film has a second thickness, wherein said first thickness is smaller than said second thickness, wherein said first thickness is 0.1 mm or more and less than 0.25 mm, and wherein said second thickness is 0.35 mm or more and 2 mm or less.

2. The substrate processing method according to claim 1, wherein said processing solution includes sulfuric acid.

3. The substrate processing method according to claim 1, wherein said plasma processing on said liquid film having said first thickness is executed in a first region of said upper surface of said substrate, and said plasma processing on said liquid film having said second thickness is executed in a second region of said upper surface of said substrate different from said first region.

4. The substrate processing method according to claim 3, wherein a density of a pattern of said resist formed in said first region is higher than a density of a pattern of said resist formed in said second region.

5. The substrate processing method according to claim 1, wherein said plasma processing on said liquid film having said first thickness is executed in a first region of said upper surface of said substrate, said plasma processing on said liquid film having said second thickness is executed in a second region of said upper surface of said substrate, and said first region and said second region at least partially overlap.

6. The substrate processing method according to claim 5, wherein said first region and said second region are entirety of said upper surface of said substrate.

7. The substrate processing method according to claim 1, wherein said plasma processing on said liquid film having said second thickness is executed after said plasma processing has been executed on said liquid film having said first thickness.

8. The substrate processing method according to claim 1, wherein said plasma processing on said liquid film having said first thickness is executed after said plasma processing has been executed on said liquid film having said second thickness.

* * * * *